United States Patent
Kim

(10) Patent No.: US 7,176,078 B2
(45) Date of Patent: Feb. 13, 2007

(54) NONVOLATILE SEMICONDUCTOR MEMORY DEVICE HAVING STRAP REGION AND FABRICATING METHOD THEREOF

(75) Inventor: Yonghee Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/167,793

(22) Filed: Jun. 27, 2005

(65) Prior Publication Data

US 2005/0285207 A1 Dec. 29, 2005

(30) Foreign Application Priority Data

Jun. 29, 2004 (KR) ............... 10-2004-0049705

(51) Int. Cl.
- H01L 27/108 (2006.01)
- H01L 29/76 (2006.01)
- H01L 29/94 (2006.01)
- H01L 31/119 (2006.01)
- H01L 21/8238 (2006.01)

(52) U.S. Cl. .............. 438/201; 257/296; 257/311; 257/314; 257/E27.084; 257/E27.091; 257/E21.646; 257/E21.66; 438/211; 438/257; 438/673

(58) Field of Classification Search ............ 257/311, 257/314, 296, 297, E27.084, E27.094, E21.646, 257/E21.66, E21.663, E21.666; 438/201, 438/211, 713, 978, 257, 673, FOR. 208, 438/FOR. 458

See application file for complete search history.

(56) References Cited

U.S. PATENT DOCUMENTS

| | | | |
|---|---|---|---|
| 6,407,941 B1 * | 6/2002 | Chevallier et al. | 365/63 |
| 6,483,749 B1 | 11/2002 | Choi et al. | 365/185.18 |
| 6,541,324 B1 * | 4/2003 | Wang | 438/201 |
| 6,611,062 B2 | 8/2003 | Kurjanowicz | 257/776 |

FOREIGN PATENT DOCUMENTS

| | | |
|---|---|---|
| KR | 1998-0006326 | 3/1998 |
| KR | 1020010019754 | 3/2001 |
| KR | 2002-0097284 | 12/2002 |
| WO | WO 01/88985 | 11/2001 |

* cited by examiner

*Primary Examiner*—Michelle Estrada
*Assistant Examiner*—Quovaunda Jefferson
(74) *Attorney, Agent, or Firm*—Mills & Onello LLP

(57) ABSTRACT

In a nonvolatile semiconductor memory device having a memory cell array region and a strap region for providing voltage to the memory cell array region, in the memory cell array region, a plurality of word lines and a plurality of source lines are formed in a row direction, and one source line is formed between two word lines. In the strap region, the word lines and the source lines extend in the row direction and are collinear with, and without separation from, the word lines and the source lines of the memory cell array region, and each of the word lines and the source lines has a word line contact and a source line contact.

63 Claims, 26 Drawing Sheets

NONVOLATILE SEMICONDUCTOR MEMORY DEVICE HAVING STRAP REGION AND FABRICATING METHOD THEREOF

BACKGROUND OF THE INVENTION

This application claims priority under 35 U.S.C. 119 to Korean Patent Application No. 2004-49705, filed on Jun. 29, 2004, in the Korean Intellectual Property Office, the disclosure of which is incorporated herein in its entirety by reference.

1. Field of the Invention

The present invention relates to a nonvolatile semiconductor memory device and a fabricating method thereof, and more particularly, to a nonvolatile semiconductor memory device having a strap region and a fabricating method thereof.

2. Description of the Related Art

Generally, a nonvolatile semiconductor memory device has a word line, a source line and a bit line at a memory cell array region thereof. Further, a memory cell, for example a nonvolatile memory cell, is formed at a memory cell array region of a semiconductor substrate, and includes a control gate, a source region, a drain region and the like. The control gate, the source region, the drain region and the like of the memory cell can extend in a row direction or a column direction of the memory device.

In order to apply a regular voltage to the control gate, the source region and the drain region constituting the memory cell, contemporary memory cells commonly include a strap region. Memory cells including strap regions are disclosed in U.S. Pat. No. 6,541,324, the contents of which is incorporated herein by reference. Referring to the U.S. patent, the conventional memory cell including a strap region is now described.

FIG. 1 is a plan view illustrating a nonvolatile semiconductor memory device having a strap region. In detail, the strap region 1 of the nonvolatile semiconductor memory device is formed at a side of a memory cell array region 2. The memory cell array region 2 has an isolation region 4 and an active region 3, which are formed in a column direction and alternate with each other in a row direction. Additionally, a word line 6 and a source line 7 are formed in the row direction in the memory cell array region 2, and the source line 7 is formed between adjacent word lines 6. Accordingly, the two word lines 6 and the source line 7 interposed therebetween constitute a pair of memory cells 5.

As generally used in the art, the term "source" can be exchanged with "drain". Further, since the word line 6 is connected to the control gate of the memory cell, the term "control gate" and "control gate line" can be exchanged with "word line".

At the strap region 1, the word line 6 and the source line 7 extend in the row direction. Accordingly, strap cells 8a and 8b are formed on the word line 6 and the source line 7 of the strap region 1 to provide regular voltage to the word line 6 and the source line 7 through electrical contacts 9a and 9b. The contact 9a represents a word line contact, and the contact 9b represents a source line contact. Additionally, a reference numeral 8a denotes the strap cell representing a word line contact region, and a reference numeral 8b denotes the strap cell representing a source line contact region. Metal line (not shown) providing the regular voltage to the contacts 9a and 9b is formed in the directions of the word line 6 and the source line 7.

However, the conventional nonvolatile semiconductor memory device of FIG. 1 has a disadvantage in that as the geometric structures become ever smaller in size, it is increasingly difficult to reliably form an electrical connection at the strap region 1. In other words, as the word line 6 and the source line 7 become closer to each other, it is increasingly difficult to form the contacts 9a and 9b for the word line 6 and the source line 7 in the strap region 1. Further, as the word lines are formed closer to each other, a bridge phenomenon can occur between the word lines. Furthermore, when a mask is used to form the strap region 1 to include the pattern of word line contact portions of FIG. 1, it is difficult to form the strap region with the pattern of the word line contact portion without the need for additional technology such as a phase shift mask or optical proximity correction (OPC) technology to achieve such fine resolution.

FIG. 2 is a plan view illustrating another conventional nonvolatile semiconductor memory device having a strap region. In detail, the nonvolatile semiconductor memory device is comprised of a memory cell array region 980 and a strap region 240. The memory cell array region 980 has an isolation region 160 and an active region 170, which are formed in a column direction and alternate with each other in a row direction. Additionally, word lines 690 and source lines 570 are formed in the row direction at the memory cell array region 980, and one source line 570 is formed between two word lines 690. In FIG. 2, a reference numeral 860 denotes a bit line contact.

The strap region 240 is divided into a source line strap cell 290 and a word line strap cell 280. The word line 690 extends in the row direction in the strap region 240, and the source line 570 extends approximately up to the source line strap cell 290 in the row direction. Specifically, the strap region 240 of FIG. 2 is formed using a mask having an "S"-shaped aperture as described in detail in FIGS. 3 and 4. Accordingly, the word line 690 is formed to have a "L"-shape or a "¬"-shape in the strap region 240, and is not connected with the source line 570.

The regular voltage is provided to the word line 690 and the source line 570 of the memory cell array region 980 through electrical contacts 1020 and 1040 provided on the word line 690 and the source line 570 of the strap region 240. The contact 1020 represents the word line contact, and the contact 1040 represents the source line contact. Metal lines (not shown) providing the regular voltage to the contacts 1020 and 1040 are formed to extend in the directions of the word line 690 and the source line 570.

FIG. 3 is a plan view illustrating a mask used for forming the strap region of FIG. 2. In detail, the strap region of FIG. 2 is formed using a mask 300 of FIG. 3. The mask 300 has an aperture 310 and a "L" or "¬"-shaped tab 1060. The aperture 310, through which light is transmitted when an exposure is performed using the mask 300, is a portion corresponding to material to be etched on a substrate. Since the aperture 310 is "S"-shaped, the mask of FIG. 3 is referred to as an "S"-shaped strap mask. The mask 300 is divided into a first mask region 320 for defining a word line strap cell 280, a second mask region 330 for defining a source line strap cell 290, and a third mask region 340 for defining a memory cell array region 980.

FIG. 4 is a plan view illustrating the strap region formed using the mask of FIG. 3. In FIG. 4, the same reference numerals as those of FIGS. 2 and 3 denote the same elements.

In detail, in the strap region formed using the mask of FIG. 3, the word line 690 is made to extended in the row direction, and the source line 570 is made to extended approximately up to the source line strap cell 290 in the row direction. Specifically, since the aperture 310 of FIG. 2 is S-shaped at the strap region, the word line 690 is formed to have the "L" or "¬"-shape, and is not connected with the source line 570.

However, in the conventional nonvolatile semiconductor memory device having the strap region of the configuration shown in FIGS. 2, 3 and 4, as a geometric structure is gradually reduced in size, with increased integration, a bridge phenomenon can occur in which the word lines or the source lines adhere to one another due to etching residues remaining between the word lines 690, that is, between control gates, or between the word line 690 and the source line 570.

Further, the conventional nonvolatile semiconductor memory device has the strap region having a "L" or "¬"-shaped pattern formed using the mask of FIG. 3. However, when the mask of FIG. 3 is used, the strap region having the "L" or "¬"-shaped pattern cannot be formed without the use of additional technology such as the phase shift mask or the OPC, which can increase fabrication costs, and lengthen fabrication times.

SUMMARY OF THE INVENTION

The present invention provides a nonvolatile semiconductor memory device having a strap region in which a bridge phenomenon can be prevented between word lines, and in which an occupation area of the strap region is reduced.

In addition, the present invention provides a fabricating method of a nonvolatile semiconductor memory device in which a bridge phenomenon can be prevented, and in which a strap region can be readily formed.

In one aspect, the present invention is directed to a nonvolatile semiconductor memory device having a memory cell array region and a strap region for providing a voltage to the memory cell array region, wherein in the memory cell array region, a plurality of word lines and a plurality of source lines extend in a row direction, and one source line is provided between two word lines, and wherein in the strap region, the word lines and the source lines extend in the row direction and are collinear with, and without separation from, the corresponding word lines and the source lines of the memory cell array region, and wherein each of the word lines and the source lines in the strap region respectively has a word line contact and a source line contact.

In one embodiment, the memory cell array region has an active region and an isolation region in a column direction.

In another embodiment, the source line contact is formed at a central portion of the strap region.

In another embodiment, a dummy active region is formed below the source line contact of the strap region and wherein the dummy active region extends in a column direction.

In another embodiment, the dummy active region extends in the column direction across a single, or multiple, source line contacts.

In another aspect, the present invention is directed to a nonvolatile semiconductor memory device having a memory cell array region and a strap region for providing a voltage to the memory cell array region, wherein in the memory cell array region, a plurality of word lines and a plurality of source lines extend in a row direction, and one source line is provided between two word lines, and wherein in the strap region, the word lines and the source lines extend in the row direction and are collinear with, and without separation from, the corresponding word lines and the source lines of the memory cell array region, and wherein each of the word lines and the source lines in the strap region respectively has a word line contact and a source line contact, and wherein a portion of the source line in the region of the source line contact is wider than a portion of the source line of the memory cell array region.

In one embodiment, the memory cell array region has an active region and an isolation region in a column direction.

In another embodiment, the source line contact is formed at a central portion of the strap region.

In another aspect, the present invention is directed to a nonvolatile semiconductor memory device having a memory cell array region and a strap region for providing a voltage to the memory cell array region, wherein in the memory cell array region, a plurality of word lines and a plurality of source lines extend in a row direction and one source line is provided between two word lines, and wherein in the strap region, the word lines and the source lines extend in the row direction, and are collinear with, and without separation from, the corresponding word lines and the source lines of the memory cell array region, and wherein the strap region includes a word line strap cell having a word line contact connected with the word line of the memory cell array region and a source line strap cell having a source line contact connected with the source line of the memory cell array region.

In one embodiment, the memory cell array region has an active region and an isolation region in a column direction.

In another embodiment, the source line contact is formed at a central portion of the strap region.

In another aspect, the present invention is directed to a method of fabricating a nonvolatile semiconductor memory device having a memory cell array region and a strap region, the method comprising: forming an insulating film on a semiconductor substrate of the memory cell array region and the strap region; patterning the insulating film of the memory cell array region and the strap region to provide a first trench at the memory cell array region and the strap region; forming a source line in the first trench of the memory cell array region and extending to the first trench of the strap region; forming a word line at, and spaced apart from, an edge of the source line of the memory cell array region, and an edge of the source line of the strap region; and forming a source line contact and a word line contact at each of the source line and the word line of the strap region.

In one embodiment, a mask, which is used when the insulating film is patterned using photolithography to provide the first trench, has a straight-lined aperture through which light is transmitted when an exposure is performed.

In another embodiment, a mask used when the insulating film is patterned using photolithography to provide the first trench has an aperture, which is straight-lined and has a central portion that is wider than a remaining portion, and through which light is transmitted when an exposure is performed.

In another embodiment, the source line contact is formed at a central portion of the strap region.

In another embodiment, a portion of the source line in the region of the source line contact is wider than a portion of portion of the source line of the memory cell array region.

In another embodiment, the source line contact of the strap region is formed on a dummy active region.

In another embodiment, the strap region includes a word line strap cell having a word line contact connected with the word line of the memory cell array region and a source line strap cell having a source line contact connected with the source line of the memory cell array region.

In another embodiment, a mask, which is used when the insulating film is patterned using photolithography to provide the first trench, is divided into a first mask region for defining the word line strap cell, a second mask region for defining the source line strap cell, and a third mask region for defining the memory cell array region.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
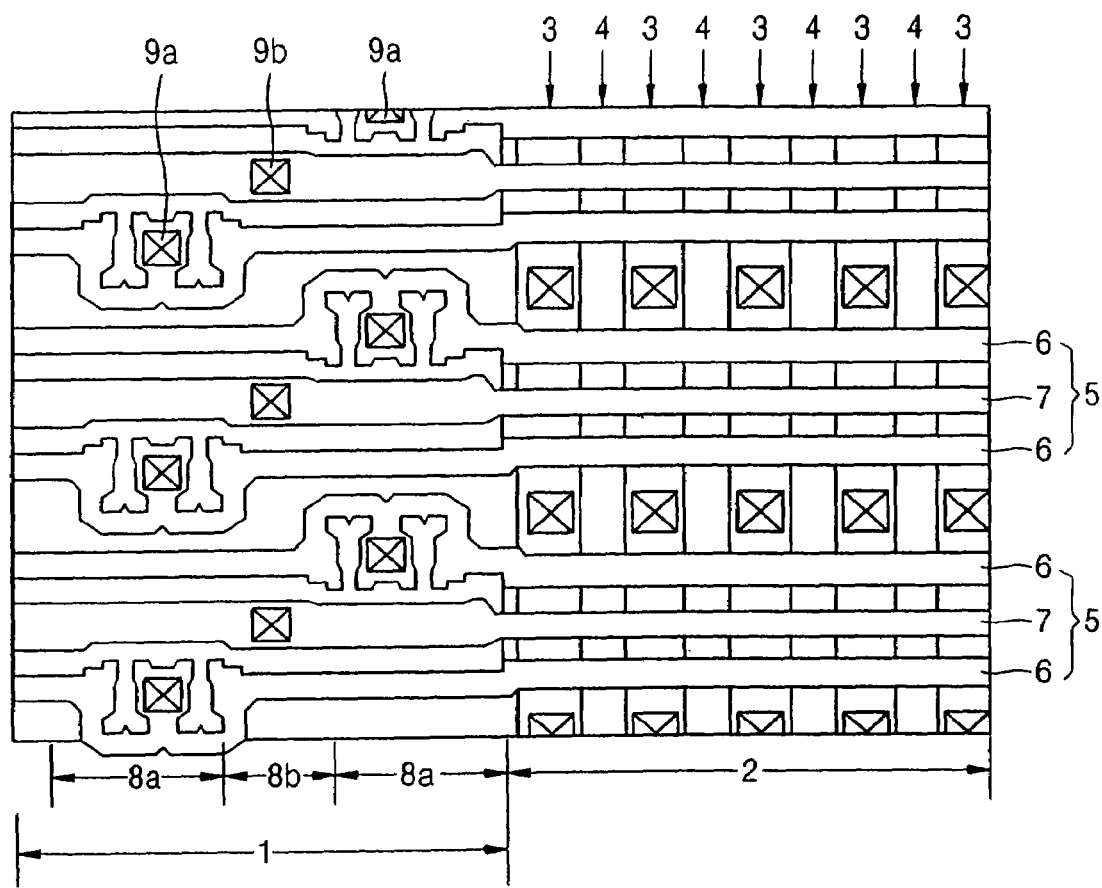
FIG. 1 is a plan view illustrating a conventional nonvolatile semiconductor memory device having a strap region.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the invention to those skilled in the art. In the drawings, the thicknesses of layers and regions are exaggerated for clarity.

First Embodiment

Figure 5:
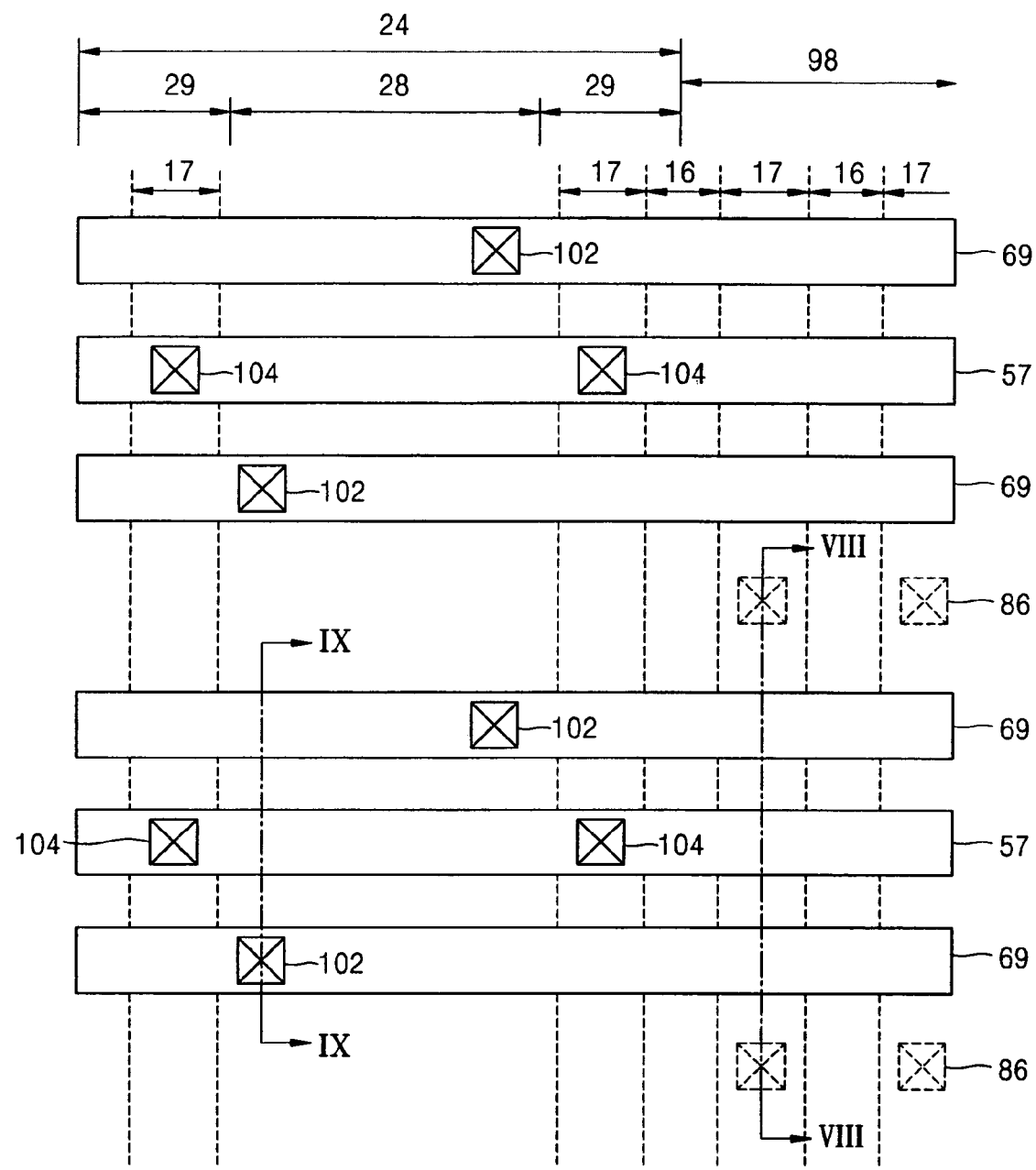
FIG. 5 is a plan view illustrating a nonvolatile semiconductor memory device having a strap region according to a first embodiment of the present invention.

FIG. 5 is a plan view illustrating a nonvolatile semiconductor memory device having a strap region according to a first embodiment of the present invention.

Figure 2:
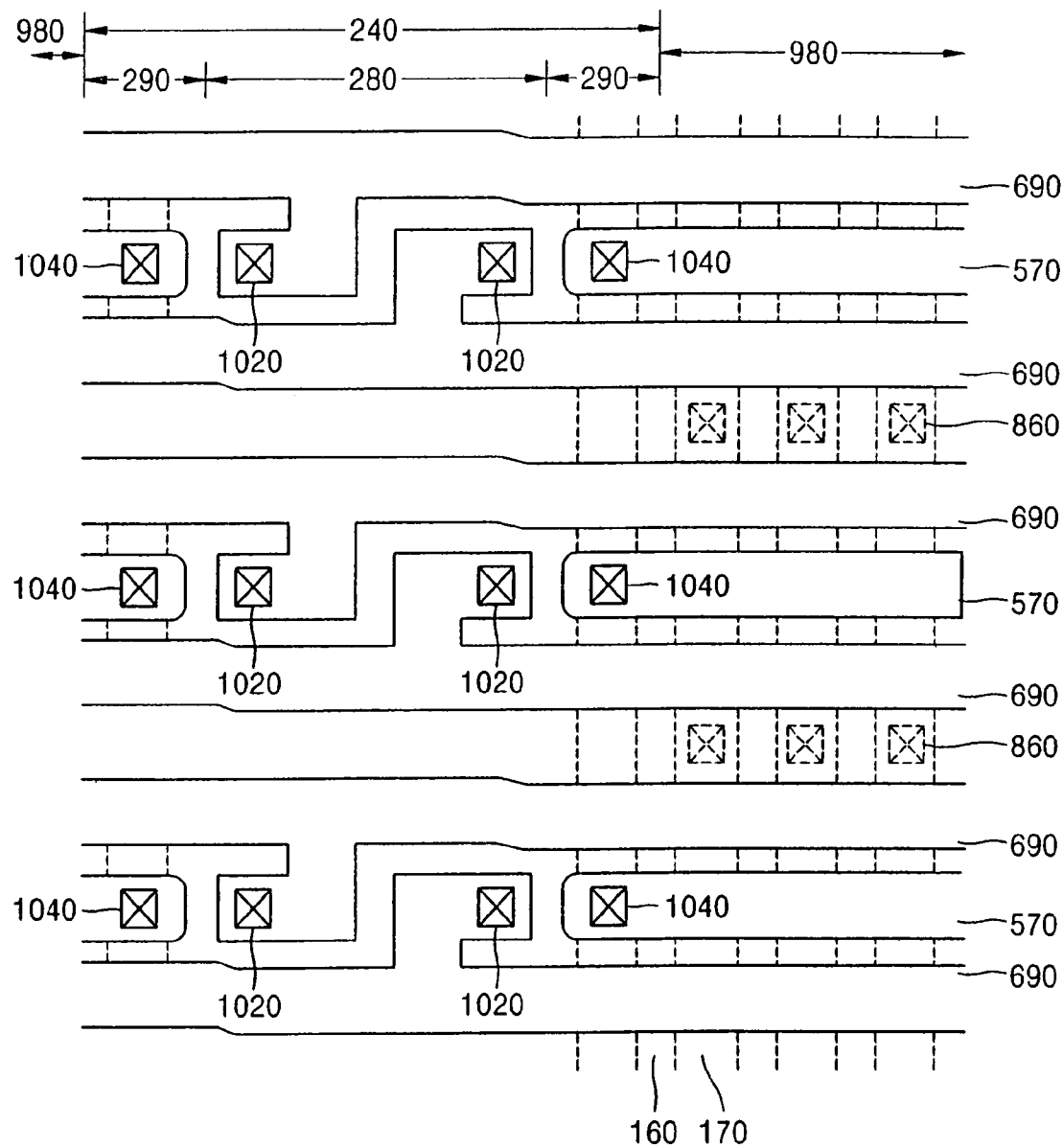
FIG. 2 is a plan view illustrating another conventional nonvolatile semiconductor memory device having a strap region.
Figure 3:
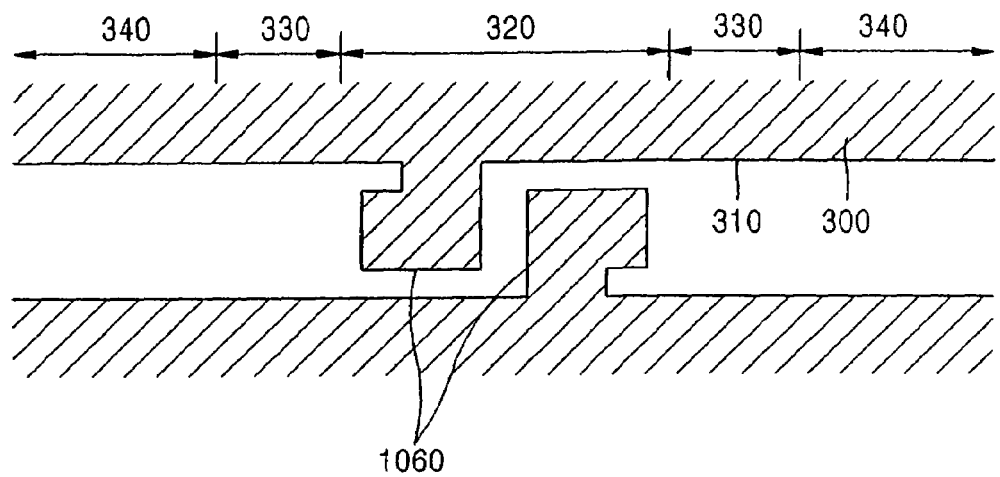
FIG. 3 is a plan view illustrating a mask used for forming the strap region of FIG. 2.
Figure 4:
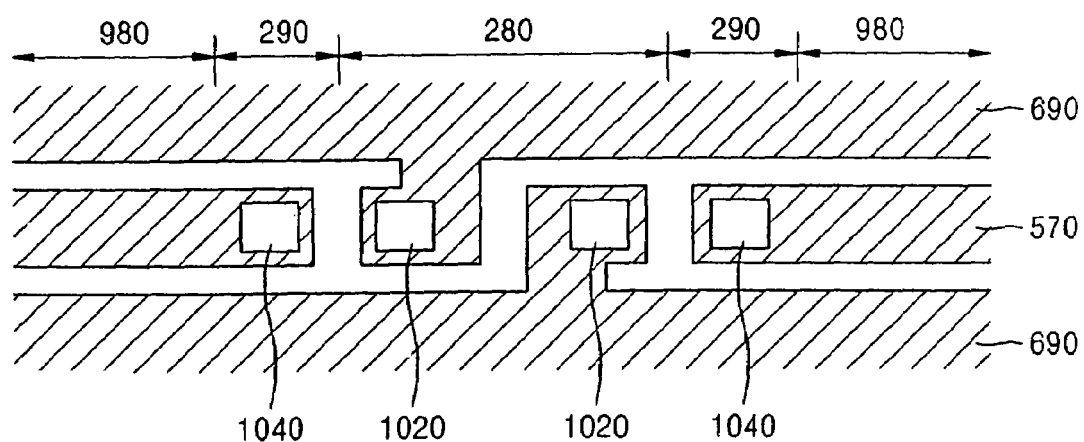
FIG. 4 is a plan view illustrating a strap region formed using the mask of FIG. 3.

In detail, the nonvolatile semiconductor memory device according to the first embodiment of the present invention includes a memory cell array region 98 and a strap region 24. The memory cell array region 98 has isolation regions 16 and active regions 17, which are formed in a column direction and alternate with each other in a row direction. Additionally, the memory cell array region 98 includes word lines 69 and source lines 57 that extend in the row direction, and a source line 57 is provided between two word lines 69. Reference numeral 86 denotes a bit line contact in FIG. 2.

The strap region 24 is divided into a source line strap cell 29 and a word line strap cell 28. In the strap region 24, the word lines 69 and the source lines 57 extend in the row direction. Specifically, unlike the conventional configuration, the source lines 57 are not separated from the strap region, and instead extend in the same manner as adjacent word lines.

The strap region 24 of FIG. 5 is formed using a straight-lined strap mask having a straight-lined aperture as described in detail below in FIGS. 6 and 7. Accordingly, the word lines 69 and the source lines 57 are in a straight-lined geometry in the strap region 24. Since the word lines 69 and source lines 57 are formed in a straight line in the strap region 24, the bridge phenomenon can be prevented between the word lines 69, and the strap region 24 can be readily formed.

In other words, the word lines 69 and the source lines 57 extend in the strap region 24 in the same manner as they extend in the memory cell array region 98. A constant voltage is supplied to the word lines 69 and the source lines 57 of the memory cell array region 98 through electrical contacts 102 and 104 formed in the strap region 24. The contact 102 represents a word line contact, and the contact 104 represents a source line contact. A metal line (not shown) for supplying the constant voltage to the contacts 102 and 104 therethrough is formed to extend in the direction of the word lines 69 and the source lines 57.

As a result, the strap region 24 is comprised of the word line strap cell 28 and the source line strap cell 29. The word line strap cell 28 has the word line contact 102 connected with the word line 69 of the memory cell array region 98, and the source line strap cell 29 has the source line contact 104 connected with the source line 57 of the memory cell array region 98.

Figure 6:
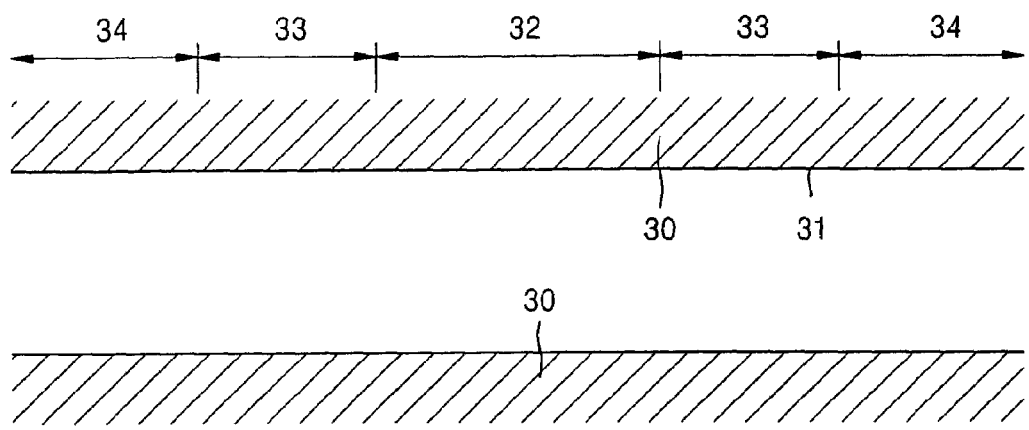
FIG. 6 is a plan view illustrating a mask used for providing a first trench and the strap region of FIG. 5.
Figure 7:
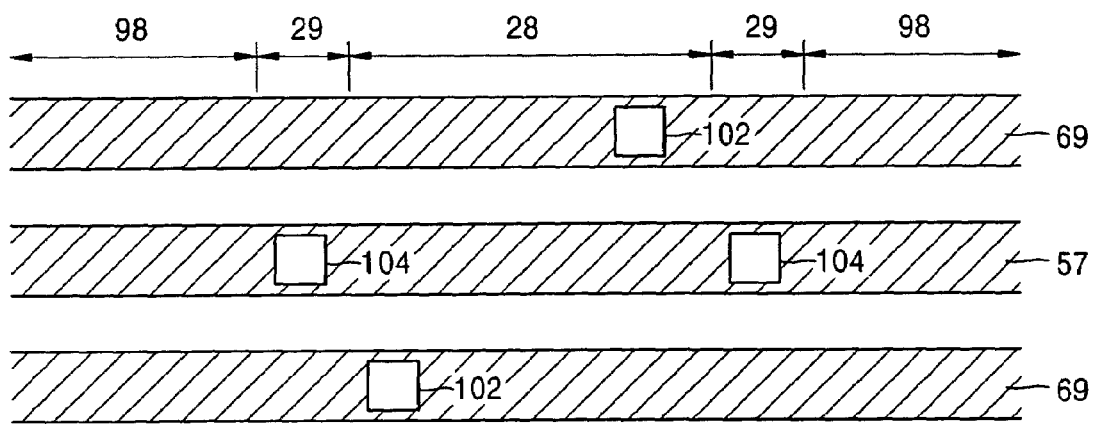
FIG. 7 is a plan view illustrating a strap region formed using the mask of FIG. 6.

FIG. 6 is a plan view illustrating a mask used for forming the strap region of FIG. 5, and FIG. 7 is a plan view illustrating the strap region formed using the mask of FIG. 6. In FIGS. 6 and 7, the same reference numerals as those of FIG. 5 denote the same elements.

In detail, the strap region 24 of FIG. 5 is formed using the mask 30 of FIG. 6. The mask 30 has a straight-lined aperture 31. The aperture 31, through which light is transmitted when an exposure is performed using the mask 30, is a portion corresponding to material to be etched on a substrate. Since the aperture 31 has edges that are straight-lined, the mask of FIG. 6 is referred to herein as a "straight-lined strap mask". The mask 30 is divided into a first mask region 32 for defining the word line strap cell 28, a second mask region 33 for defining the source line strap cell 29, and a third mask region 34 for defining the memory cell array region 98.

In the strap region formed using the straight-lined strap mask 30 of FIG. 6, the word lines 69 and the source lines 57 extend in the row direction as shown in FIG. 7. Specifically, since the aperture 31 of FIG. 6 is straight-lined in the strap region 24, the source lines 57 also extend in a straight line through the strap region. The electrical contacts 102 and 104 are formed on the word lines 69 and the source lines 57 of the strap region 24. The contact 102 represents the word line contact, and the contact 104 represents the source line contact.

Next, a fabricating method of the nonvolatile semiconductor memory device is described with reference to FIGS. 8A through 8N and FIGS. 9A through 9N. For the convenience of description, a split-gate type nonvolatile semiconductor memory device is described as an example.

Figure 8A:
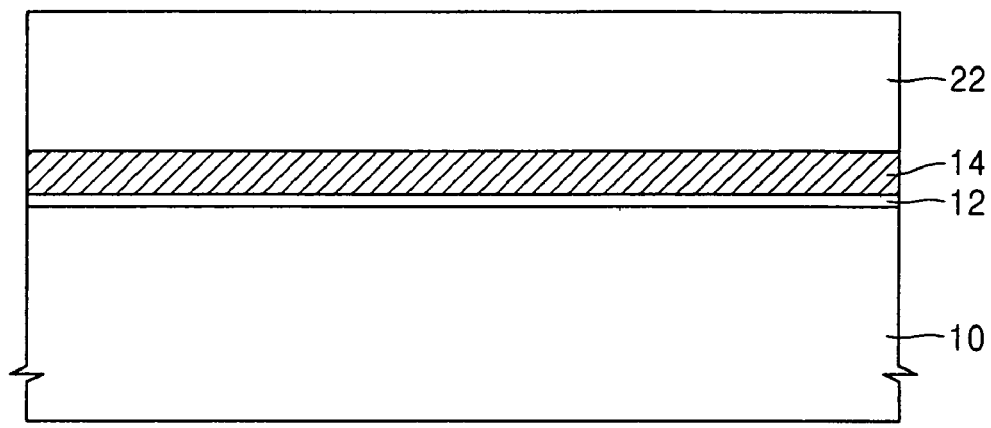
FIGS. 8A through 8N and FIGS. 9A through 9N are respectively sectional views illustrating a fabricating method of a nonvolatile semiconductor memory device taken along lines VIII—VIII and IX—IX of FIG. 5.
Figure 9A:
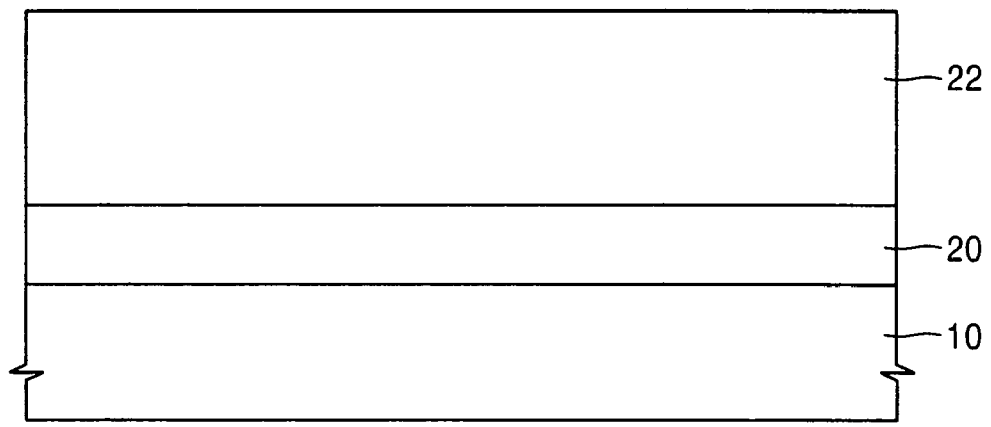
Figure 8B:
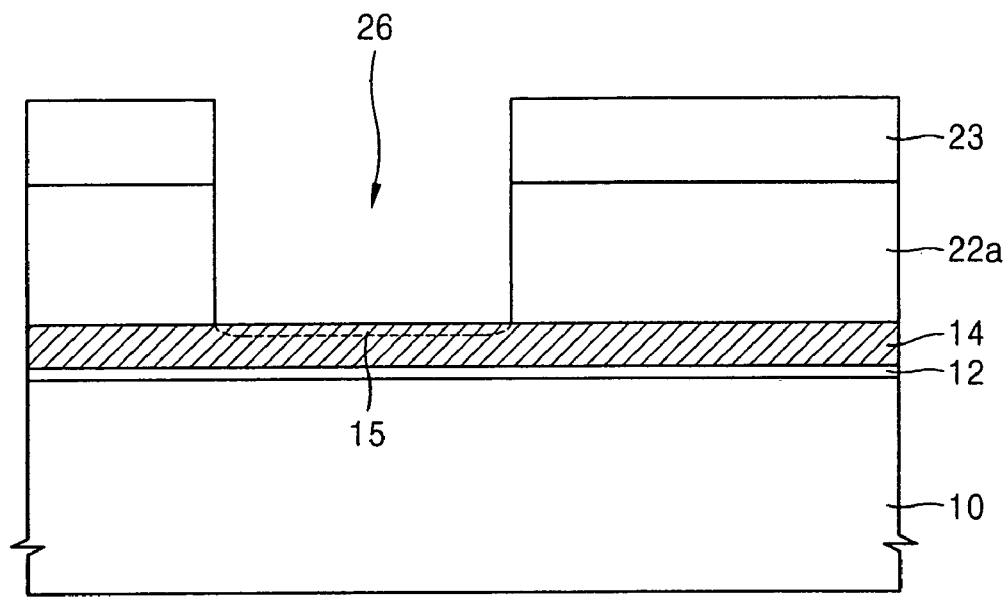
Figure 9B:
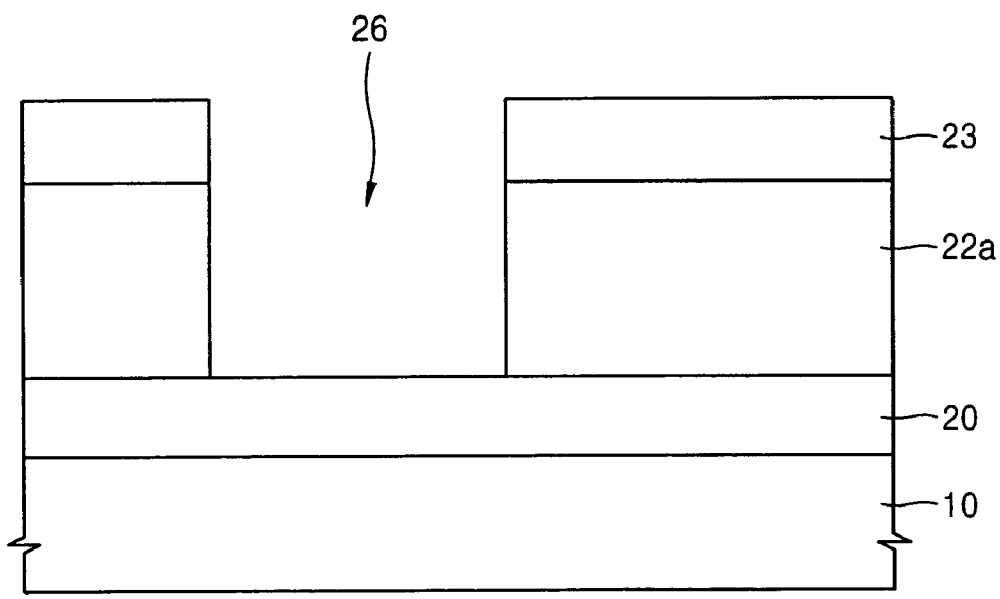
Figure 8C:
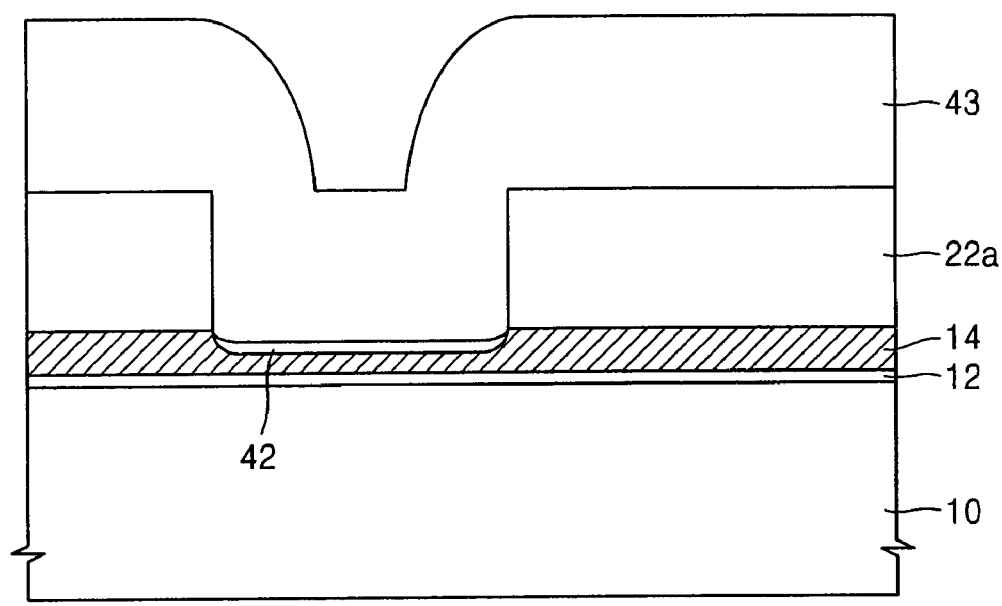
Figure 9C:
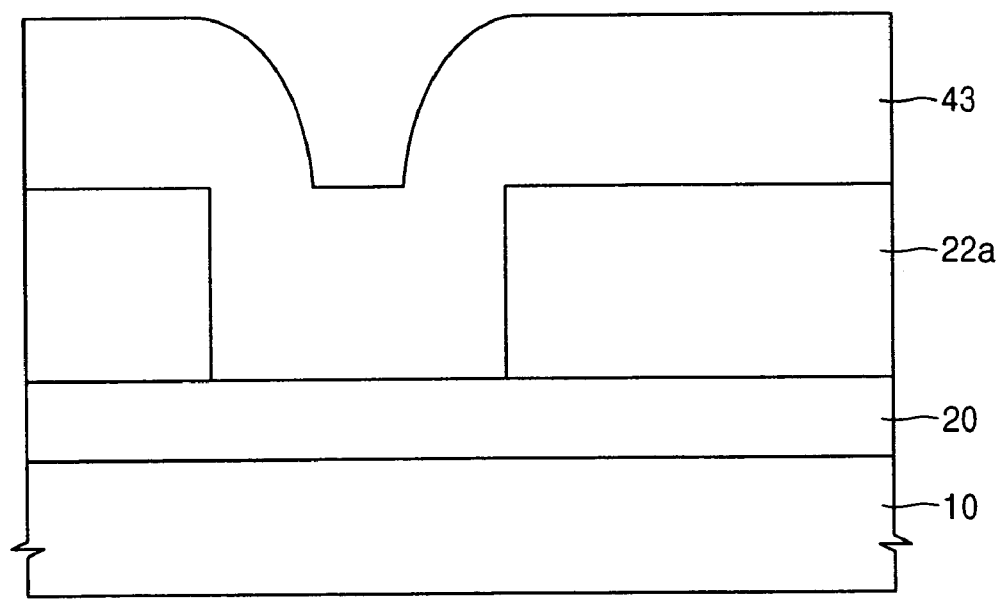
Figure 8D:
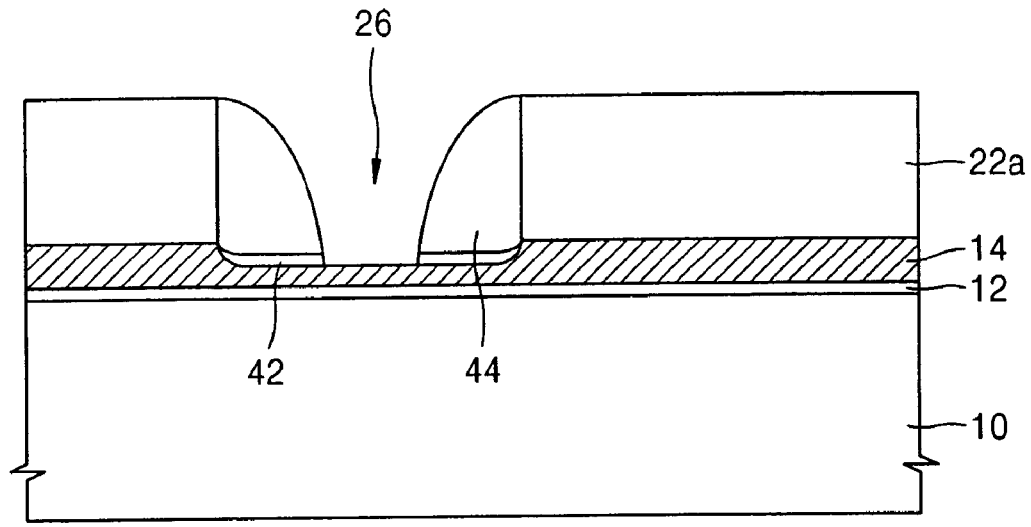
Figure 9D:
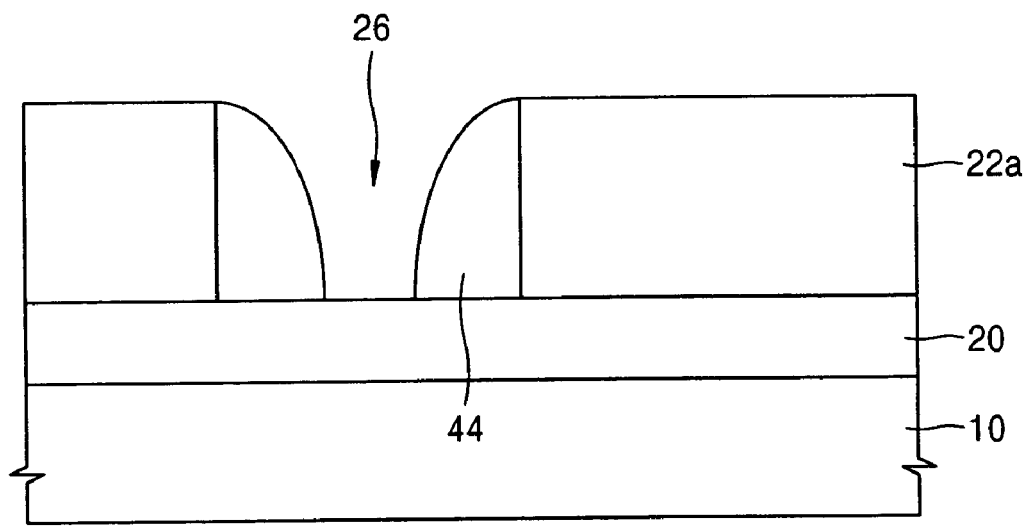
Figure 8E:
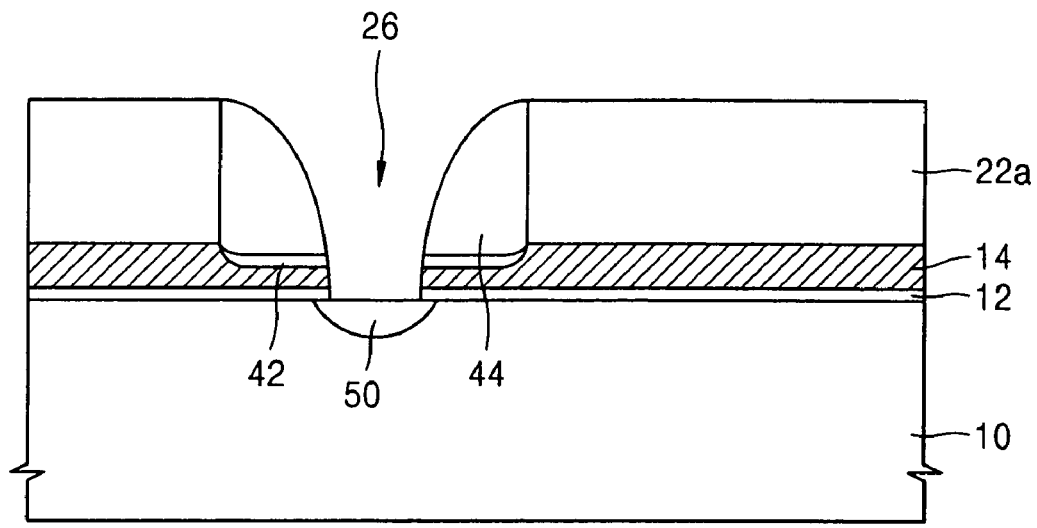
Figure 9E:
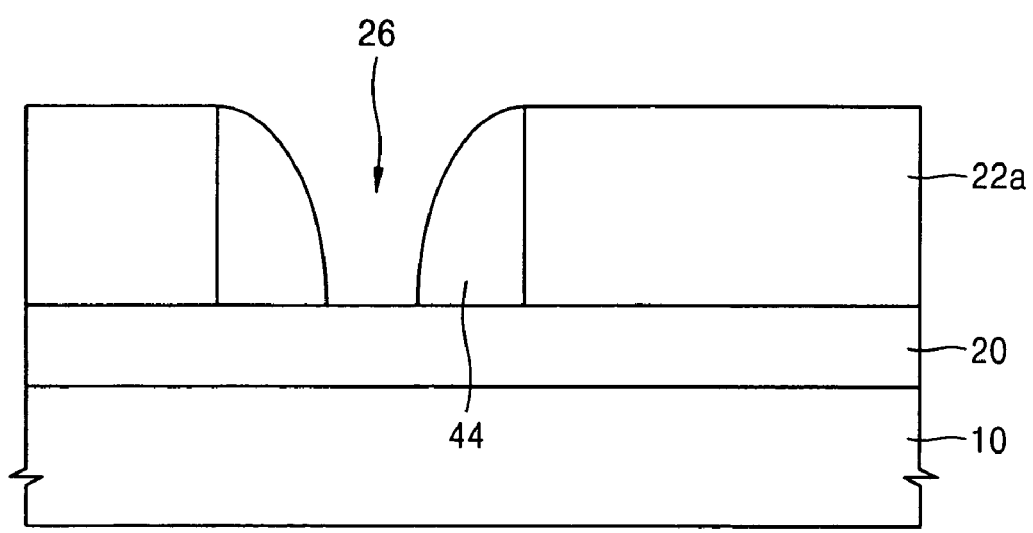
Figure 8F:
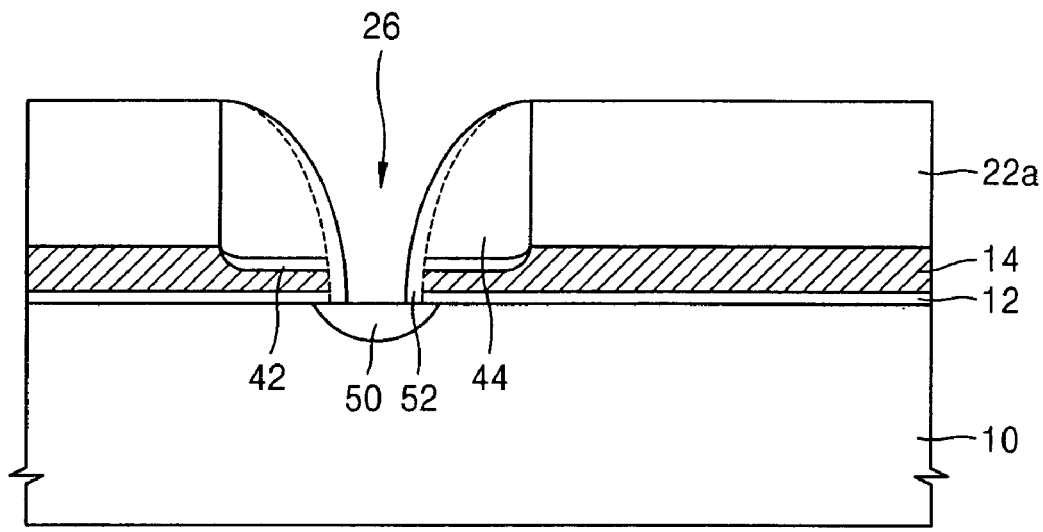
Figure 9F:
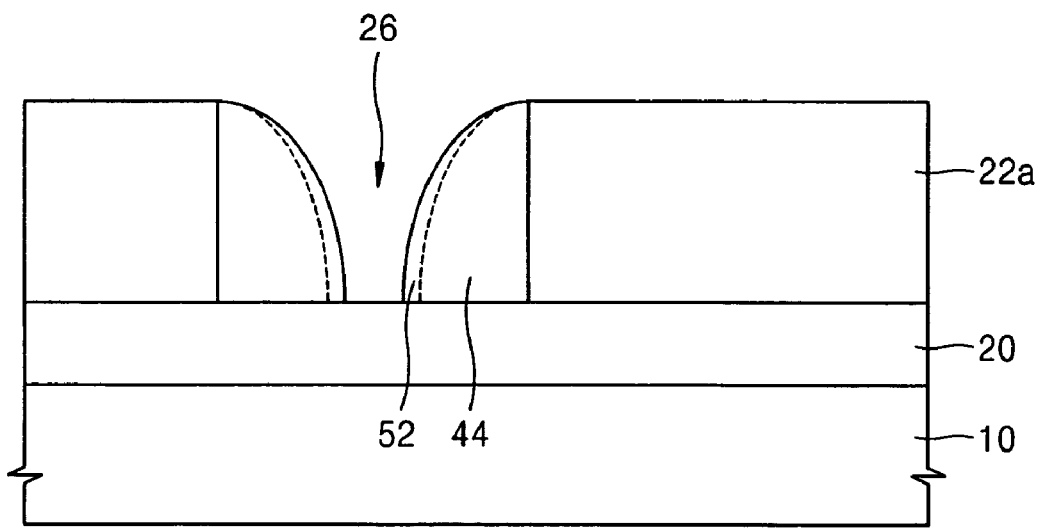
Figure 8G:
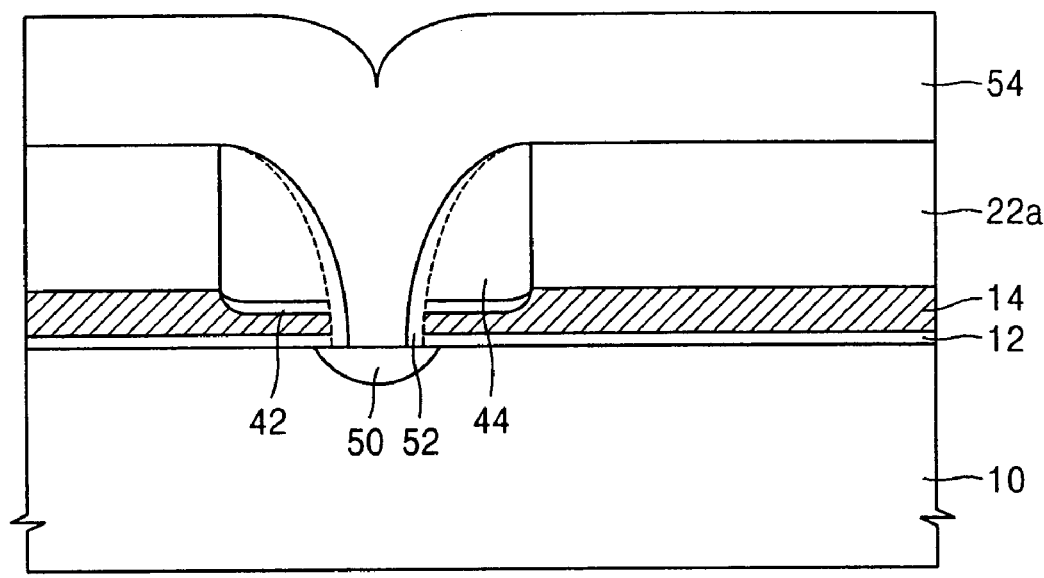
Figure 9G:
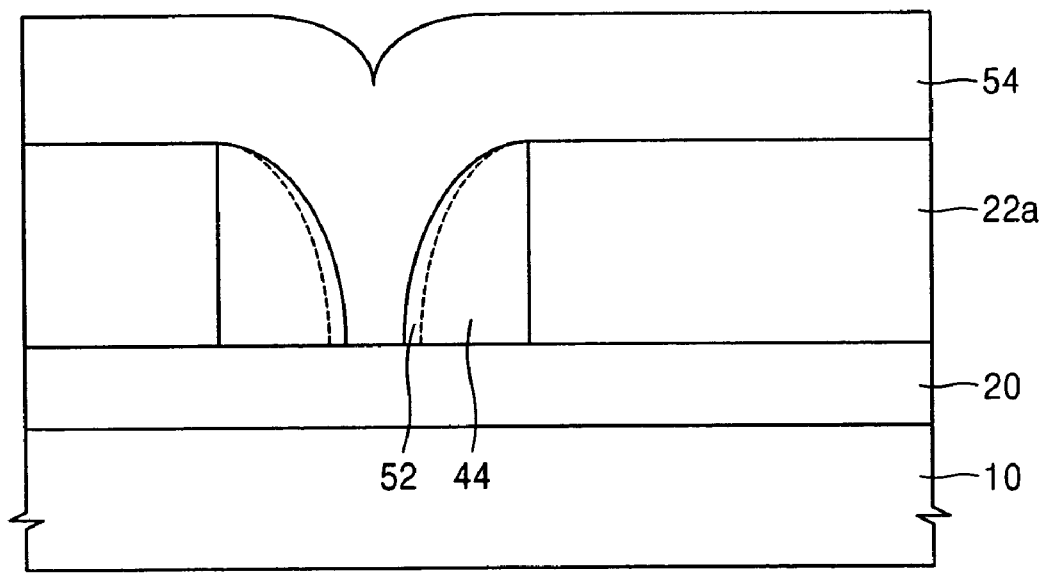
Figure 8H:
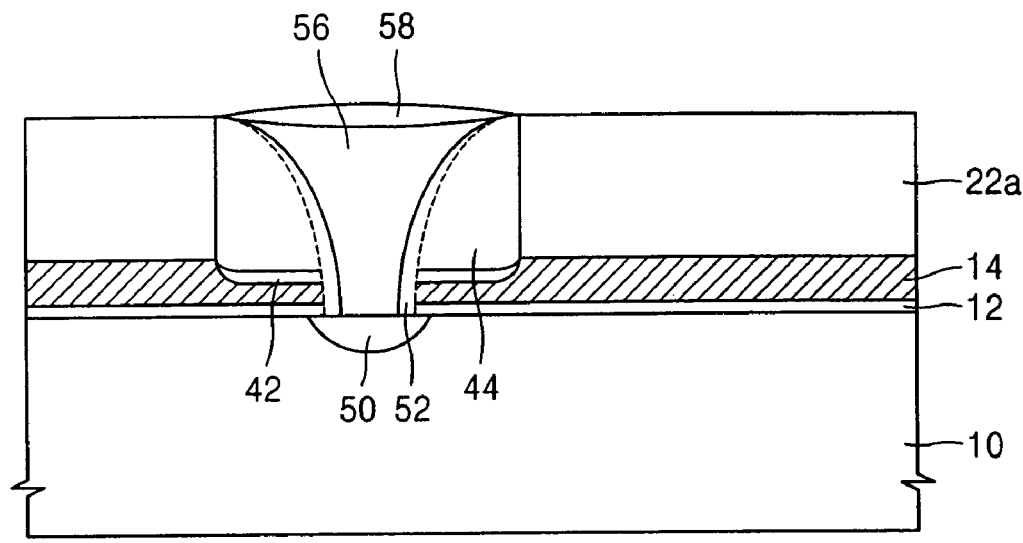
Figure 9H:
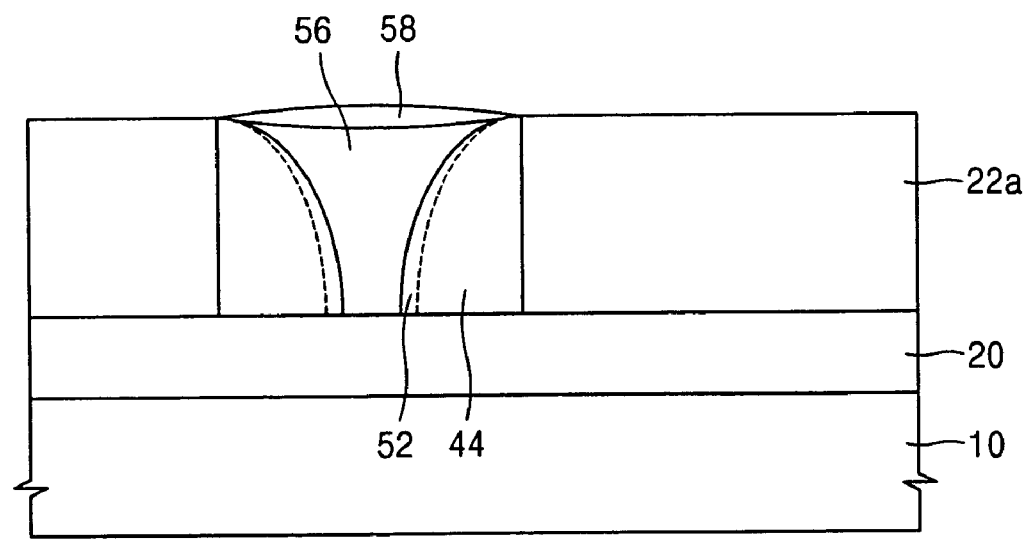
Figure 8I:
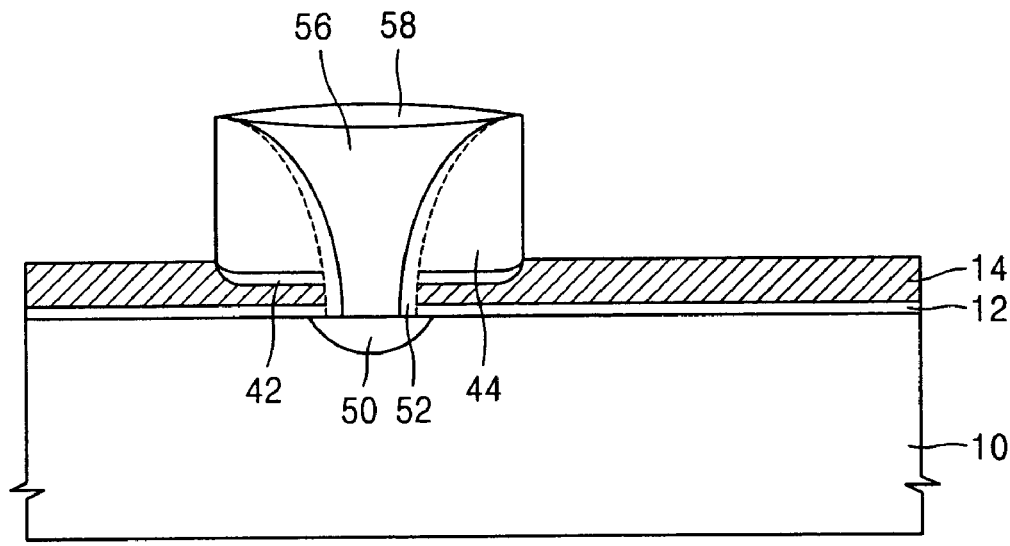
Figure 9I:
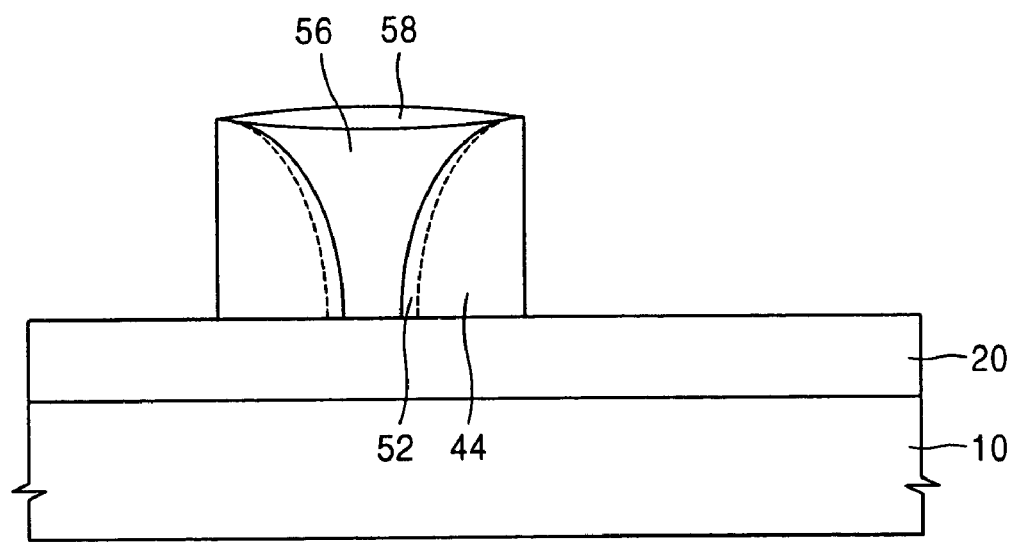
Figure 8J:
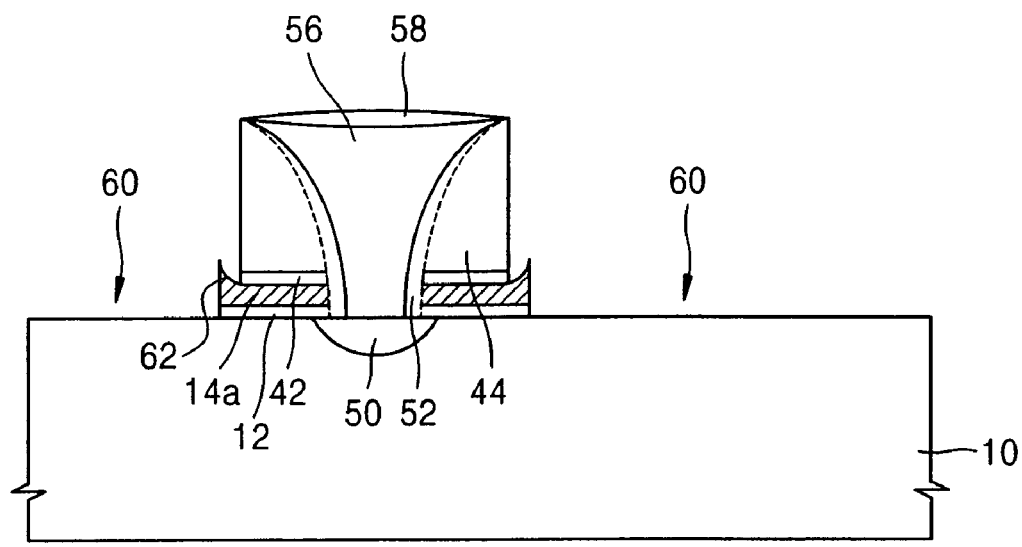
Figure 9J:
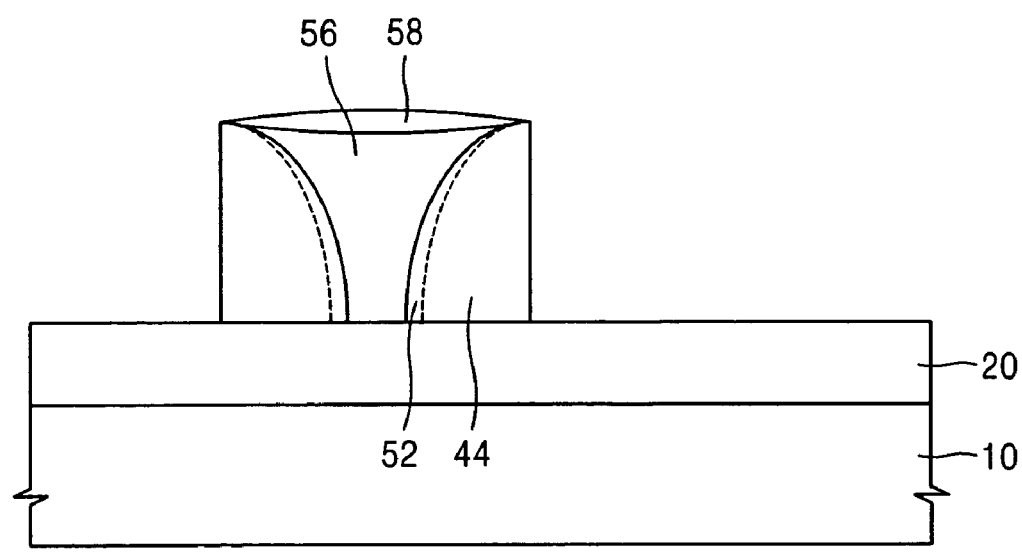
Figure 8K:
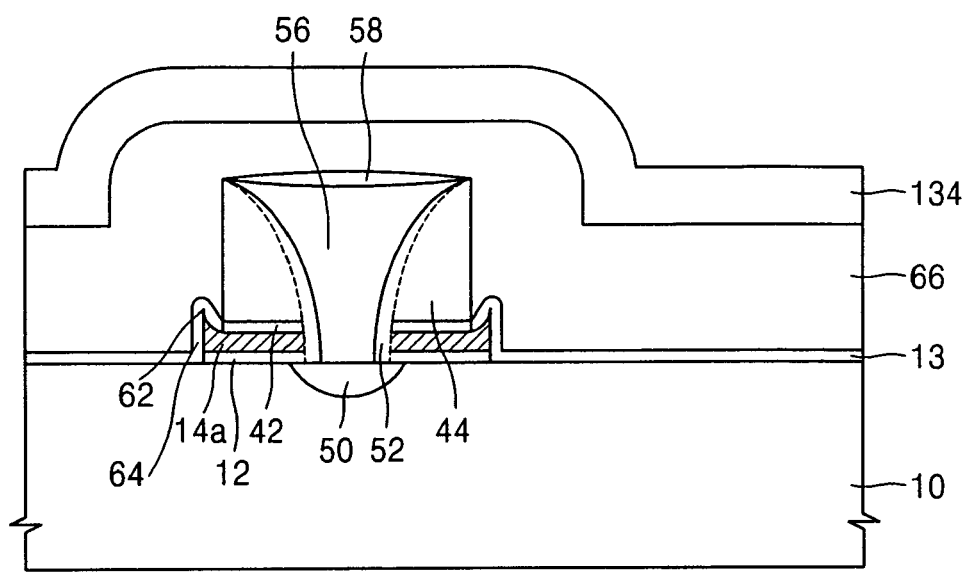
Figure 9K:
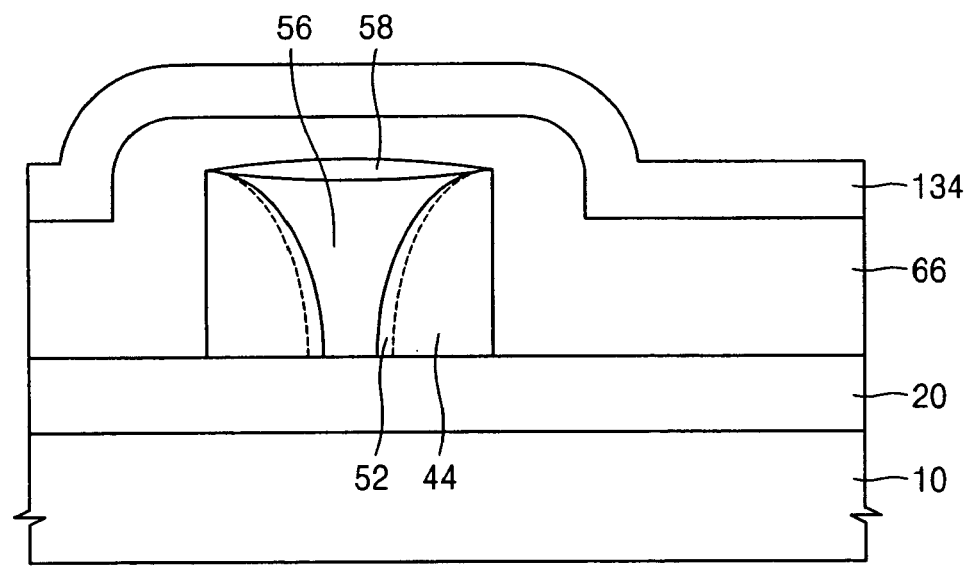
Figure 8L:
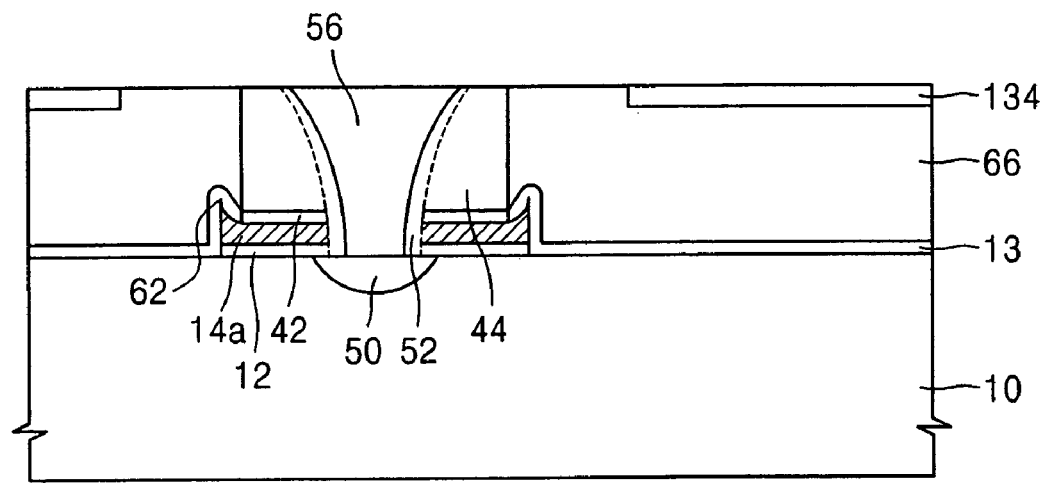
Figure 9L:
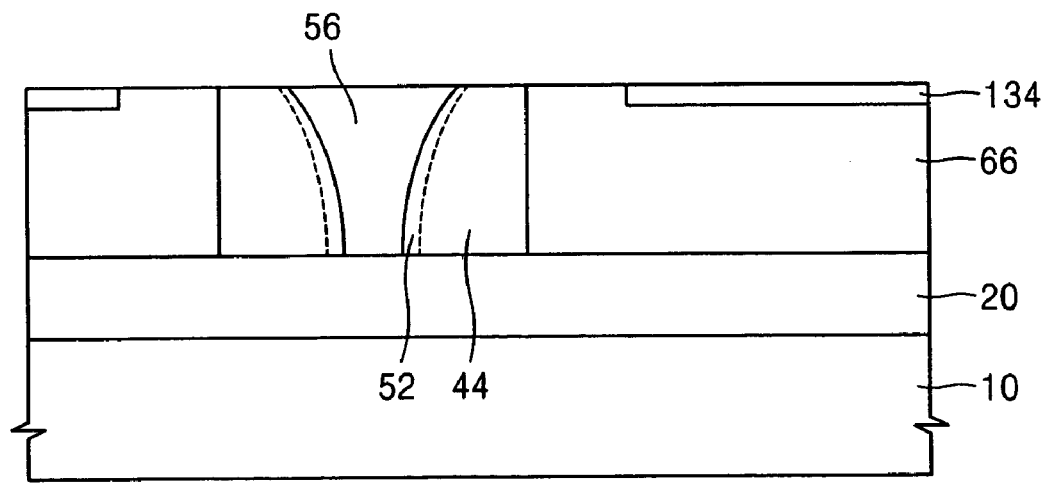
Figure 8M:
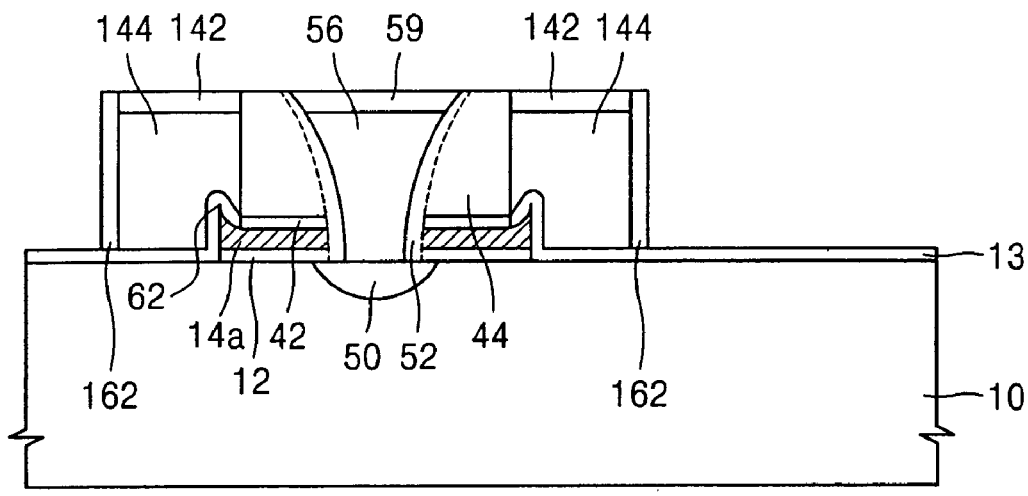
Figure 9M:
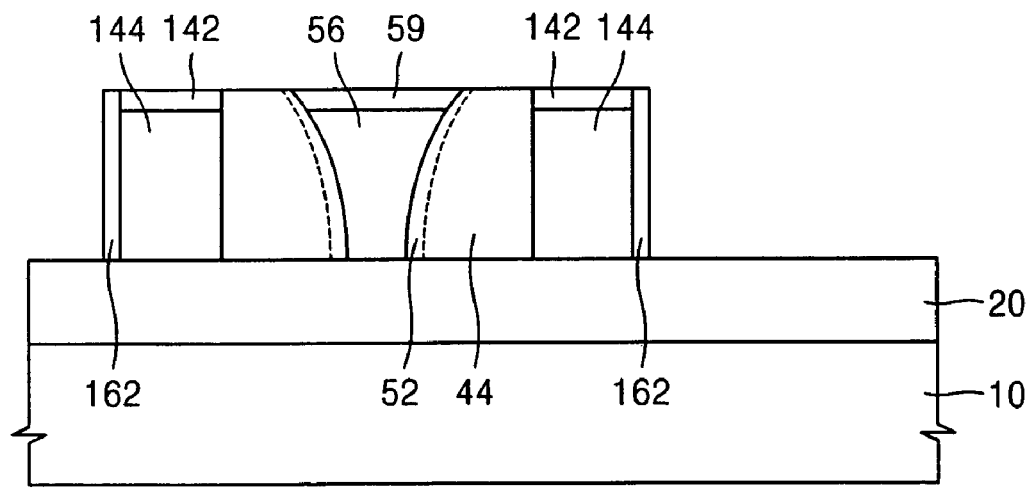
Figure 8N:
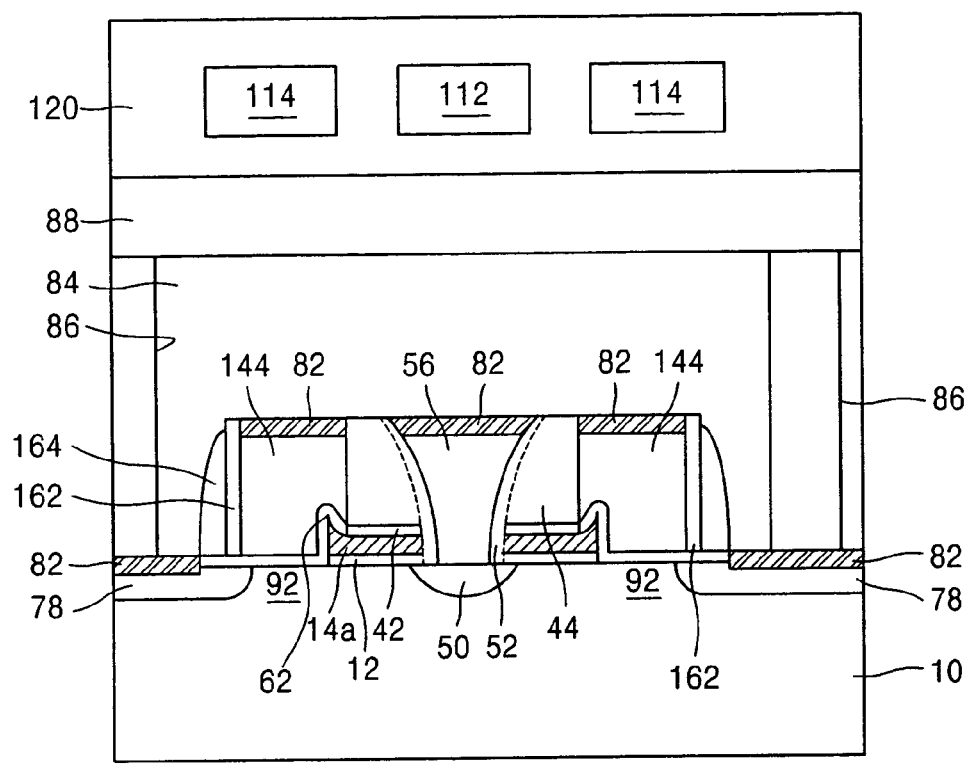
Figure 9N:
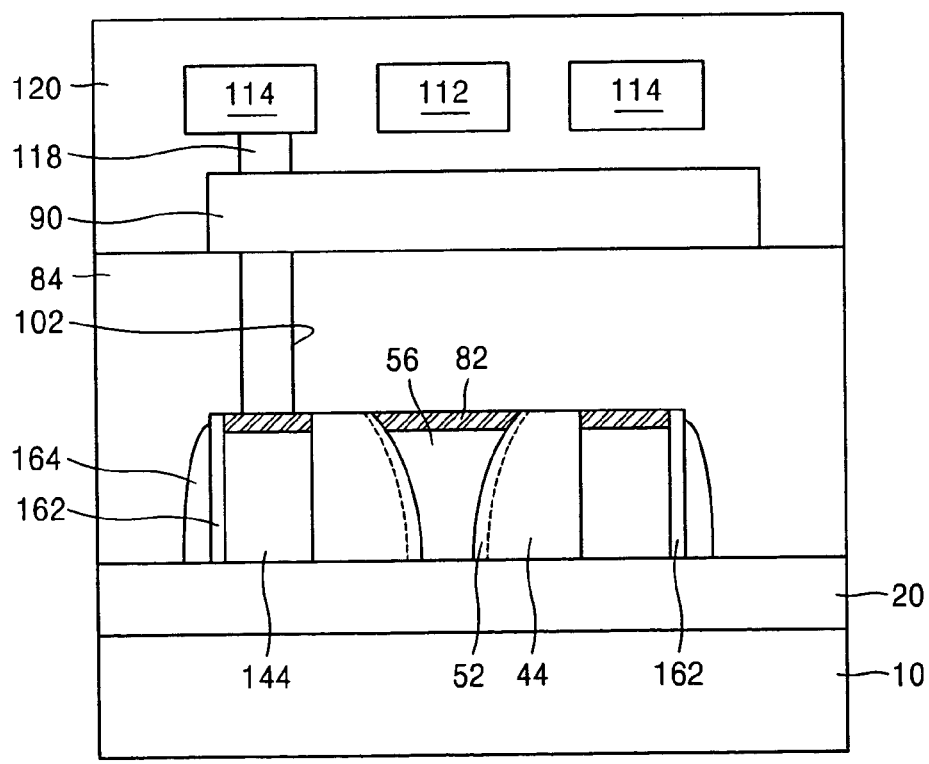

FIGS. 8A through 8N and FIGS. 9A through 9N are respectively sectional views illustrating the fabricating method of the nonvolatile semiconductor memory device taken along lines VIII—VIII and IX—IX of FIG. 5. FIGS. 8A through 8N are sectional views illustrating a memory cell array region of the nonvolatile semiconductor memory device, and FIGS. 9A through 9N are sectional views illustrating the strap region having the word line contact 102 of the nonvolatile semiconductor memory device.

Referring to FIGS. 8A through 9A, a first gate oxide film 12 and a floating gate first conductive layer 14 are formed in the memory cell array region of the semiconductor substrate (or a semiconductor well) 10, that is, on the active region 17 (see FIG. 5). The first conductive layer 14 can be formed using a doped polysilicon film. Consequently, a first nitride film 22 (insulating layer) is formed at the memory cell array region 98 and on the isolation region 20 of the strap region 24.

Referring to FIGS. 8B and 9B, a photoresist pattern 23 is formed on the first nitride film 22 of the memory cell region and the strap region. After that, the first nitride film 22 is etched using the photoresist pattern 23 as a mask to provide a first trench 26 and a first nitride film pattern 22a. The first trench 26 exposes the surface of the first conductive layer 14 of the memory cell array region.

Figure 11A:
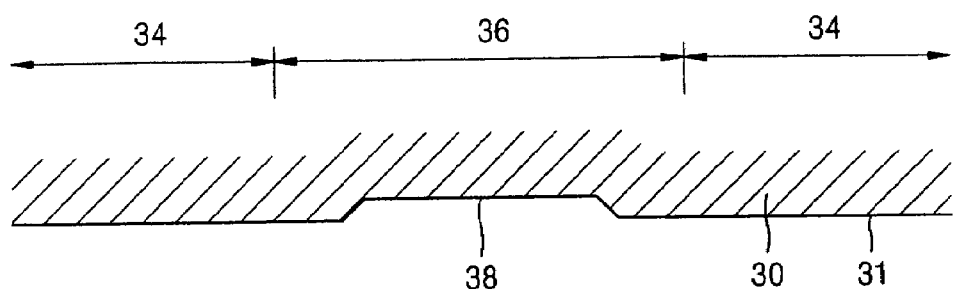
FIG. 11A is a plan view illustrating a mask used for providing a first trench and the strap region of FIG. 10.

The mask, which is used when the photoresist pattern 23 is formed to provide the first trench 26, is the straight-lined mask of FIG. 6 or the straight-lined mask having a protruded center portion of FIG. 11A described below. Specifically, the first trench 26 of the strap region illustrated in FIG. 9B is provided using the straight-lined mask of FIG. 6 or FIG. 11A. The source lines are extended to and formed in the trench 26 of the strap region in a later process, and the source lines are also identically extended to and formed at the memory cell array region of FIG. 8B. Here, a detailed description for the straight-lined mask of FIG. 6 or FIG. 11A is omitted.

Next, the exposed first conductive layer 14 of the memory cell array region of FIG. 8B can optionally be round-etched as denoted by a reference numeral 15. Through the round etch, the exposed first conductive layer 14 can be formed to have sharp edges at both upper portions.

Referring to FIGS. 8C and 9C, the photoresist pattern 23 is removed. Next, the first conductive layer 14 exposed within the first trench of the memory cell array region is oxidized to form an oxide film 42. As such, the floating gate first conductive layer 14 is round-etched and its exposed surface is thermally oxidized to lead to a more sharpened tip portion of the floating gate to be later formed. Accordingly, the electric field of the control gate is more concentrated at the tip portion, and accordingly, erase efficiency is enhanced.

Next, a first oxide film 43 is formed at the memory cell region and the strap region.

Referring to FIGS. 8D and 9D, the first oxide film 43 is anisotropically etched to form first oxide spacers 44 at both sidewalls of the first nitride pattern 22a. In the strap region, the first oxide spacers 44 are also formed at both sidewalls of the first nitride film pattern 22a of the isolation region 20. When the first oxide spacer 44 is formed, the oxide film 42 of the memory cell array region is also etched at its center portion to expose a center portion of the first conductive layer 14.

Referring to FIGS. 8E and 9E, the first conductive layer 14 and a first gate oxide film 12 are etched using the first oxide spacer 44 of the memory cell region as the mask to expose a source-intended region. The strap region is not affected when the first conductive layer 14 and the first gate oxide film 12 are etched. Next, impurities are implanted into the source-intended region within the first trench to form a source region 50.

Referring to FIGS. 8F and 9F, second oxide spacers 52 are formed at both sidewalls of the first oxide spacers 44 within the first trench of the memory cell region. The oxide film, which is formed on the semiconductor substrate 10 when the second oxide spacer 52 is formed, is removed to expose the semiconductor substrate. When the second oxide spacer 52 is formed, it is also formed even at the strap region. After the second oxide spacer 52 is formed, impurities can be implanted to form the source region 50.

Referring to FIGS. 8G and 9G, a source line second conductive layer 54 is formed in both the memory cell region and the strap region. The second conductive layer 54 is formed of impurity-doped polysilicon. The source line second conductive layer 54 is formed to bury the first trench 26.

Referring to FIGS. 8H and 9H, the second conductive layer 54 is polished through chemical-mechanical polishing (CMP) until the first nitride film pattern 22a is exposed to form a second conductive layer pattern 56 (source line) within the first trench 26 of the memory cell region. Specifically, the second conductive layer pattern 56 (source line) is formed even within the first trench 26 of the strap region in the same way as the memory cell array region. After that, the second conductive layer pattern 56 formed using the CMP can be etched-back to have a lower height than a surface of the first oxide spacer 44. Next, the second conductive layer pattern 56 of the memory cell array region and the strap region is oxidized at its surface to form the second oxide film 58.

Referring to FIGS. 8I and 9I, a first nitride film pattern 22a of the memory cell array region and the strap region is removed. Accordingly, the first conductive layer 14 of the memory cell array region is exposed. Additionally, the isolation region 20 of the strap region is exposed.

Referring to FIGS. 8J and 9J, the first conductive layer 14 is etched using the first oxide spacer 44 and the second oxide film 58 of the memory cell array region as a mask to form a first conductive layer pattern 14a (floating gate). When the first conductive layer 14 is etched, sharp edges 62 that protrude in an upward direction are formed at a side edge of the first conductive layer pattern 14a.

When the first conductive layer 14 is etched, the first gate oxide film 12 is also etched to provide a second trench 60 at both sides of the first conductive layer pattern 14a of the memory cell region, that is, at sides of the second conductive layer pattern 56 (source line). Additionally, when the first conductive layer 14 of the memory cell array region is etched, the strap region is not affected, but the second trench 60 is provided even at the circumference of the second conductive layer pattern 56 (source line) of the strap region.

The second trench 60 provided at the edges of the second conductive layer pattern 56 of the memory cell array region is a region in which the word line is to be formed. Also, the second trench 60 provided at the edges of the second conductive layer pattern 56 of the strap region is a region in which the word line of the memory cell array region is extended.

Pre-cleaning is performed on the exposed semiconductor substrate 10 for a control gate insulating film 13, a third insulating film 64 for a tunneling oxide film performed later, and a tip overlap of the first conductive layer pattern 14a (floating gate). The tip overlap, formed at the side edge of the first conductive layer pattern 14a (floating gate) by the pre-cleaning functions, improves an erasure characteristic of the memory cell.

Referring to FIGS. 8K and 9K, the third insulating film 64 is formed at the side surface of the first conductive layer pattern 14a, and the control gate insulating film 13 is formed on the exposed semiconductor substrate 10. After that, a third conductive layer 66 is formed on an entire surface of the memory cell array region and the strap region. The third conductive layer 66 is formed of impurity-doped polysilicon. Next, a second nitride film 134 is formed on the third conductive layer 66.

Referring to FIGS. 8L and 9L, the second nitride film 134 and the third conductive layer 66 are formed using CMP to expose a surface of the second conductive layer pattern 56 of the memory cell array region and the strap region. At this time, the first oxide spacer 44 is etched to have a flattened upper surface. The third conductive layer 66 is formed over the semiconductor substrate 10 at both sides of the first oxide spacer 44 by performing CMP of the second nitride film 134 and the third conductive layer 66. Additionally, the second nitride film 134 is formed on a portion of the surface of the third conductive layer 66.

Referring to FIGS. 8M and 9M, a thermal oxide film is used to respectively concurrently form a fourth oxide film 142 and a fifth oxide film 59 on a surface of the third conductive layer 66 and on a surface of the second conductive pattern 56 of the memory cell array region and the strap region. Next, the second nitride film 134 formed on a portion of the surface of the third conductive layer 66 is removed. After that, the third conductive layer 66 is etched using the fourth oxide film 142, the fifth oxide film 59 and the first oxide spacer 44 as a mask, to form a third conductive layer pattern 144 (word line). Next, a fifth oxide film 162 is formed at both sidewalls of the third conductive layer pattern 144.

Referring to FIGS. 8N and 9N, after a nitride film is formed on an entire surface of the memory cell array region and the strap region of the resulting structure, the nitride film is anisotropically etched to form a nitride spacer 164 at both sidewalls of the third conductive layer pattern 144. At this time, the fourth oxide film 142 and the fifth oxide film 59 formed on the surfaces of the third conductive layer pattern 144 and the second conductive layer pattern 56 are removed. After that, impurities are implanted at both sidewalls of the nitride spacer 164 of the memory cell array region to form a drain region 78.

One memory cell provided at the memory cell array region includes the source region 50, the drain region 78, and a channel region 92 interposed therebetween. Further, the memory cell has the first conductive layer pattern 14a (floating gate) and the third conductive layer pattern (control gate) formed in a split gate type on the channel region 92. The memory cell performs a program operation by injecting electrons into the first conductive layer pattern 14a (floating gate) through hot carrier injection. The memory cell performs an erase operation by F-N tunneling the injected electrons to the third conductive pattern 144 (control gate) through the up-protruded sharp edges 62 from the side edge of the first conductive layer pattern 14a.

Next, metal silicide contacts 82 are formed on surfaces of the drain region 78, the second conductive layer pattern 56 and the third conductive layer pattern 144. At the same time, the metal silicide contacs 82 are formed on surfaces of the second conductive layer pattern 56 and the third conductive layer pattern 144 of the strap region. A first passivation layer 84 is formed on an entire surface of the memory cell array region and the strap region. Next, a bit line contact 86 is formed in the first passivation layer 84 of the memory cell array region, and a word line contact 102 is formed in the first passivation layer 84 of the strap region.

After that, a bit line 88 is formed in the memory cell array region to connect with the bit line contact 86. A strap jumper 90 is formed at the strap region to connect with the word line contact 102. Next, a second passivation layer 120 is formed at the memory cell array region and the strap region. Consecutively, after a metal via 118 is formed in the second passivation layer 120 of the strap region, the strap jumper 90 and a word line strap 114 (metal line) is connected with each other through the metal via 118. Reference numeral 112 denotes a source line strap.

Second Embodiment

Figure 10:
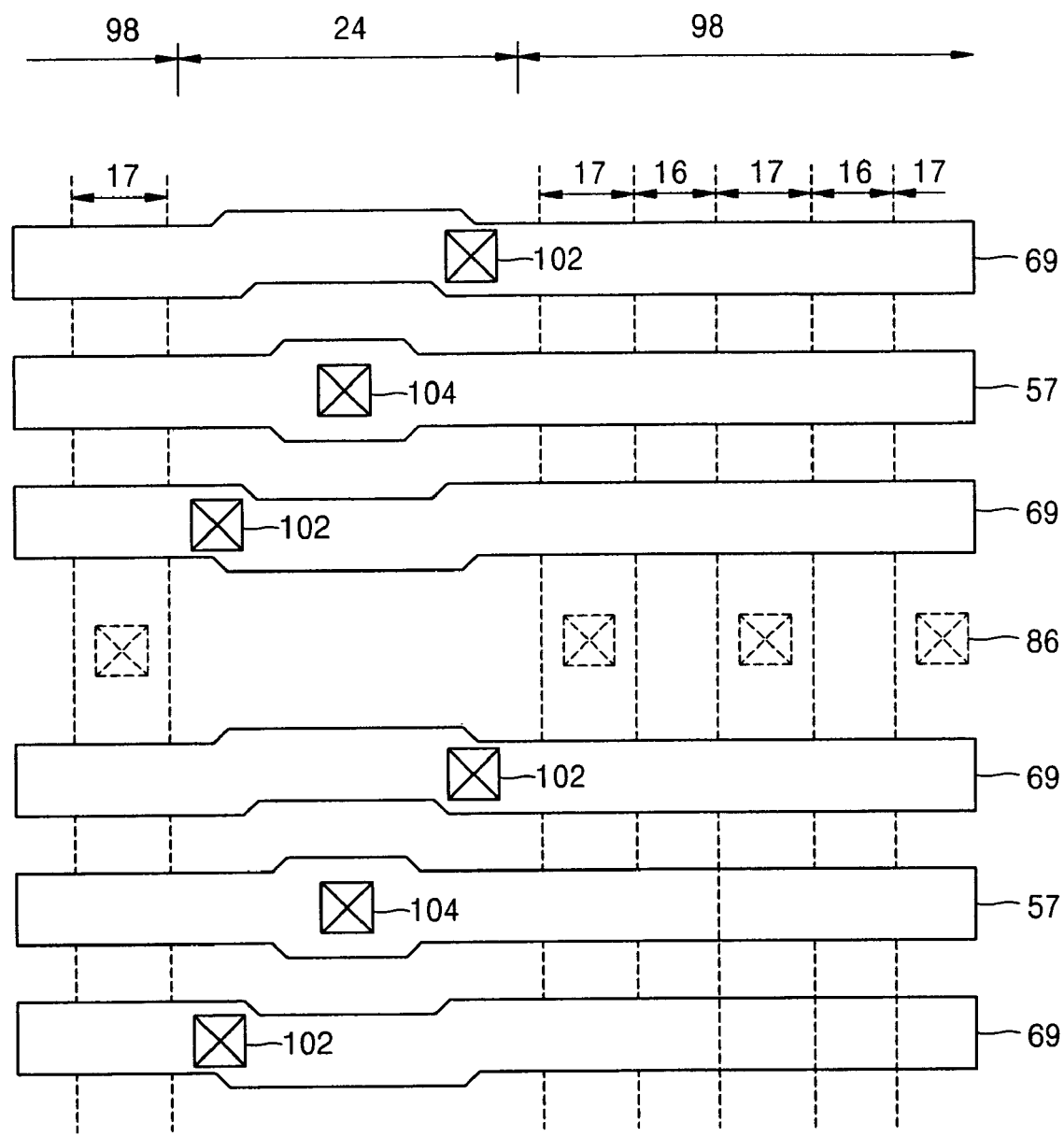
FIG. 10 is a plan view illustrating a nonvolatile semiconductor memory device having a strap region according to a second embodiment of the present invention.

FIG. 10 is a plan view illustrating a nonvolatile semiconductor memory device having a strap region according to a second embodiment of the present invention. In FIG. 10, the same reference numerals as those of FIG. 6 represent the same elements.

In detail, the inventive nonvolatile semiconductor memory device has the same construction as the first embodiment, except that a source line 57 having the source line contact 104 has an extended width and the source line contact 104 is formed in a central portion of the strap region 24. In the case where the source line 57 is extended in width, the source line contact 104 can be readily formed on the source line 57. Additionally, if the source line contact 104 is formed at the center of the strap region 24, the strap region can be reduced in area.

Figure 11B:
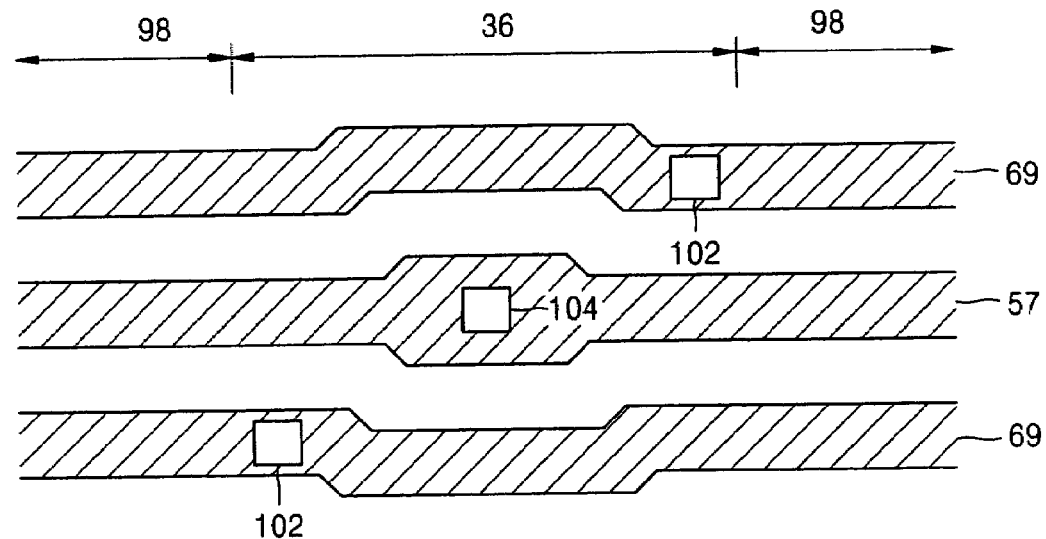
FIG. 11B is a plan view illustrating a strap region formed using the mask of FIG. 11A.

The strap region 24 is formed using a straight-lined strap mask (reference numeral 30 of FIG. 11A) having an aperture, which is generally straight-lined and includes an outward protrusion, as illustrated in FIGS. 11A and 11B. Accordingly, the source line 57 formed using such a mask is straight-lined while being extended in width in the strap region 24. In other words, the source line 57 having the source line contact 104 has a larger width than the source line 57 of the memory cell region.

FIG. 11A is a plan view illustrating a mask used for forming the strap region of FIG. 10, and FIG. 11B is a plan view illustrating the strap region formed using the mask of FIG. 11A. In FIGS. 11A and 11B, the same reference numerals as those of FIG. 10 denote the same elements.

In detail, the strap region 24 of FIG. 10 is formed using a mask 30 of FIG. 11A. The mask 30 includes aperture 31, which is generally configured in a straight-lined configuration and has a center portion having an outward protrusion 38. The aperture 31, through which light is transmitted when an exposure is performed using the mask 30, is a portion corresponding to material to be etched on a substrate. Since the aperture 31 has a straight-lined shape having the protrusion 38, the mask of FIG. 11A is referred to as a strap mask having a straight-lined shape with outwardly protruded central portion. The mask 30 is divided into a first mask region 36 for defining the strap region 24, and a second mask region 34 for defining the memory cell array region 98.

At the strap region formed using the protruded and straight-lined strap mask 30 of FIG. 11A, the word lines 69 and the source lines 57 extend in the row direction as shown in FIG. 11B. Specifically, since the aperture 31 of FIG. 11A has the protruded and straight-lined shape at the strap region 24, the source lines 57 are extended in length while also being extended in width in the strap region. The electrical contacts 102 and 104 are formed on the word lines 69 and the source lines 57 of the strap region 24. The contact 102 represents the word line contact, and the contact 104 represents the source line contact.

Third Embodiment

Figure 12:
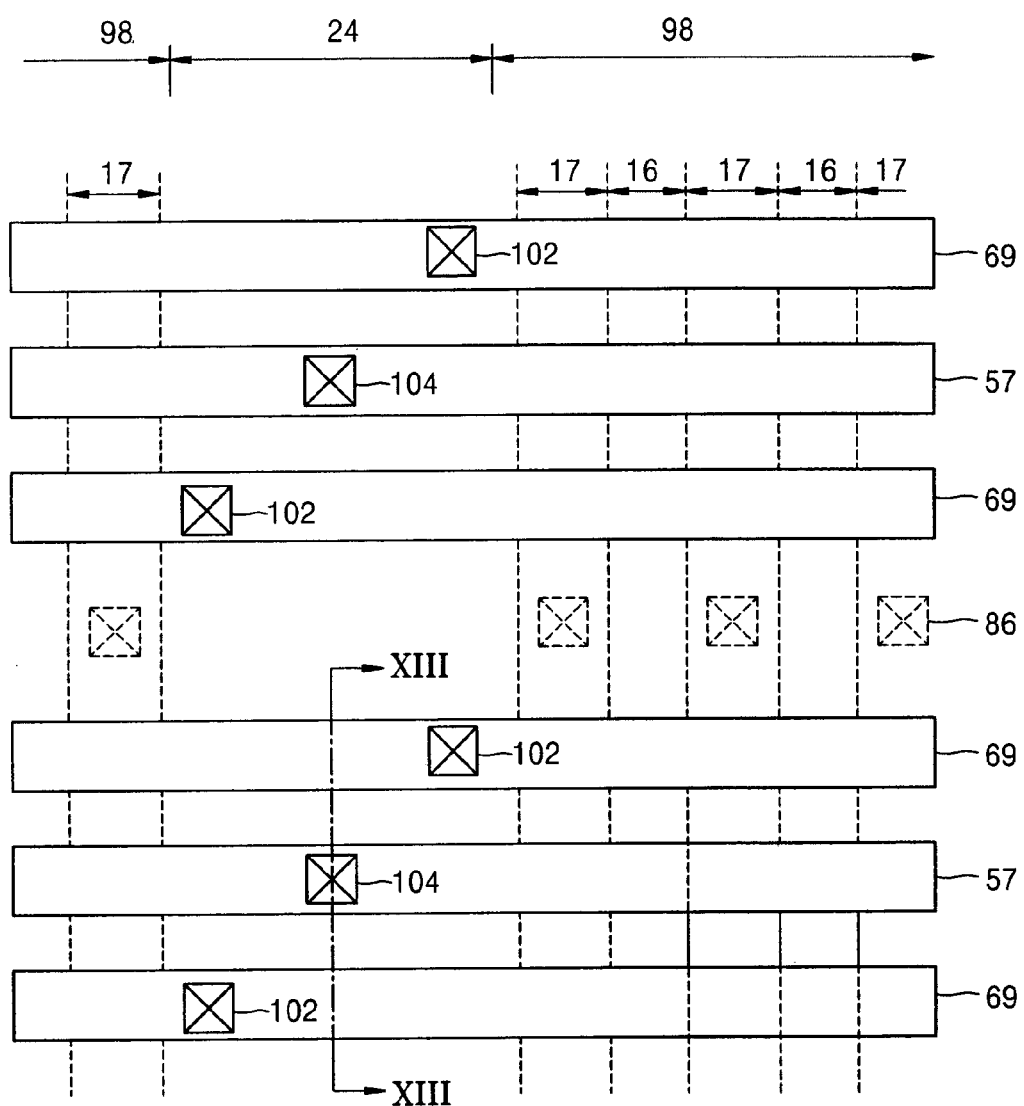
FIG. 12 is a plan view illustrating a nonvolatile semiconductor memory device having a strap region according to a third embodiment of the present invention.
Figure 13:
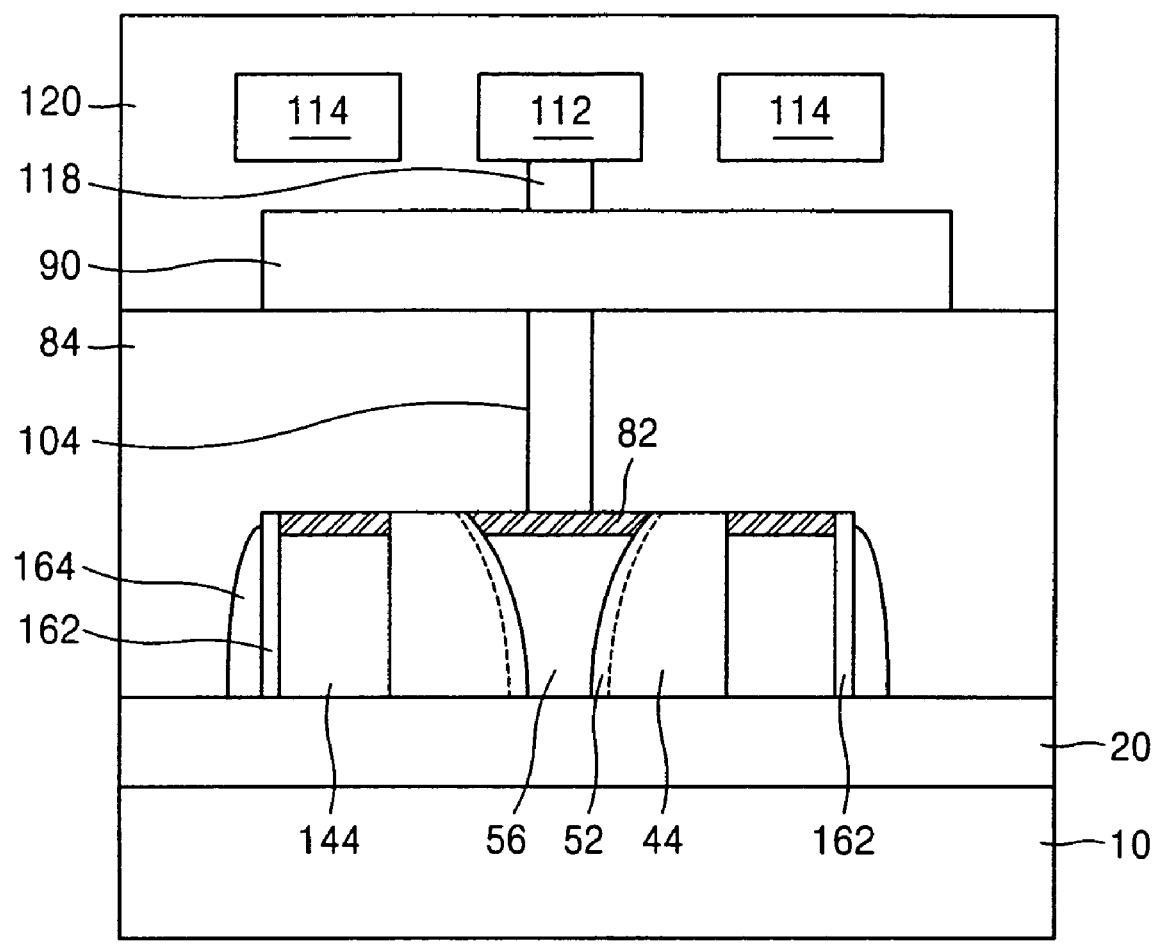
FIG. 13 is a sectional view taken along line XIII—XIII of FIG. 12.

FIG. 12 is a plan view illustrating a nonvolatile semiconductor memory device having a strap region according to a third embodiment of the present invention, and FIG. 13 is a sectional view taken along line XIII—XIII of FIG. 12. In FIG. 12, the same reference numerals as those of FIG. 6 denote the same elements. In FIG. 13, the same reference numerals as those of FIG. 9N denote the same elements.

In detail, the inventive nonvolatile semiconductor memory device is the same as the first embodiment excepting that a source line contact 104 is formed at central portion of a strap region 24. If the source line contact 104 is formed at the center of the strap region 24, the overall size of the strap region 24 can be reduced in area. As shown in the sectional view of FIG. 13, the source line contact 104 is connected with a source line strap 112 by using a metal jumper 90 and a metal via 118.

Fourth Embodiment

Figure 14:
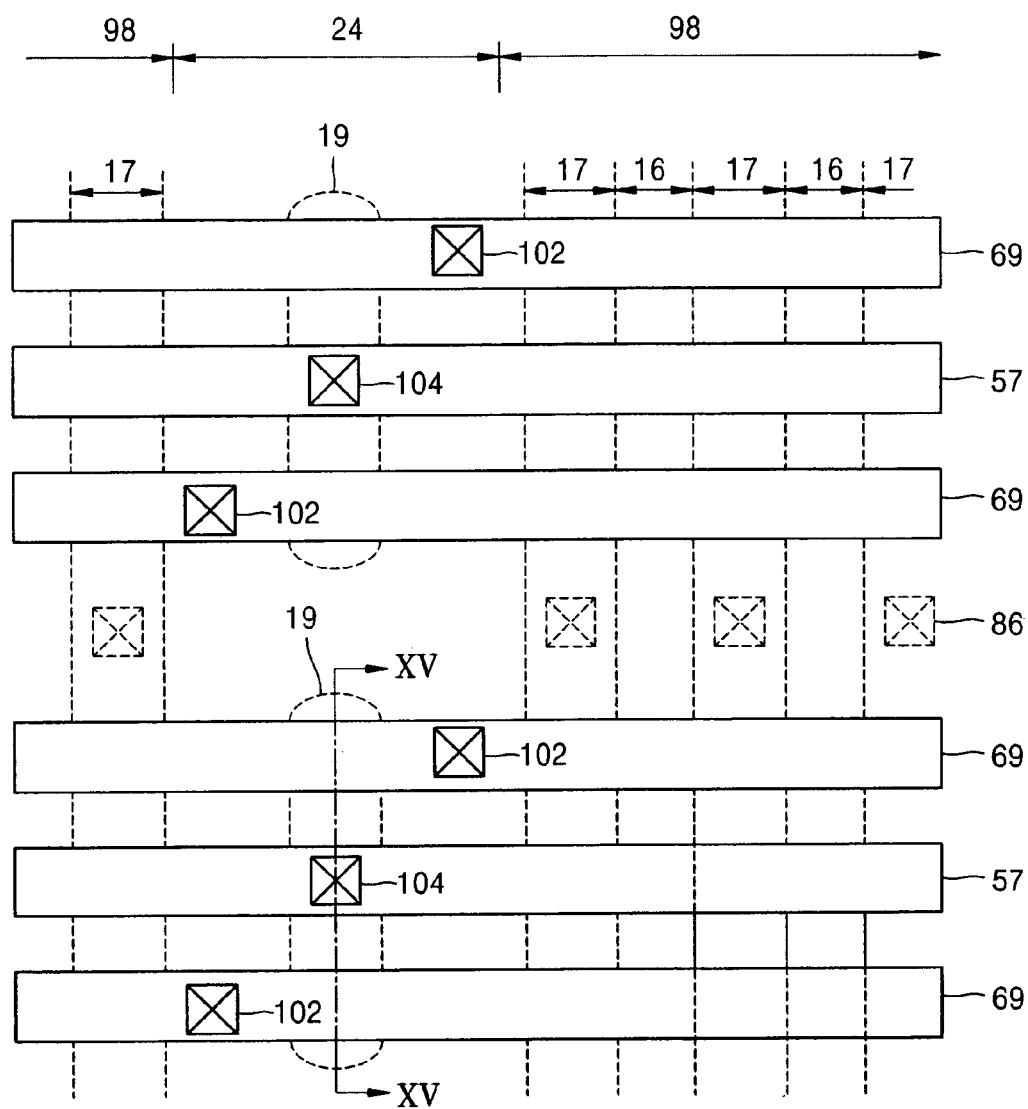
FIG. 14 is a plan view illustrating a nonvolatile semiconductor memory device having a strap region according to a fourth embodiment of the present invention.
Figure 15:
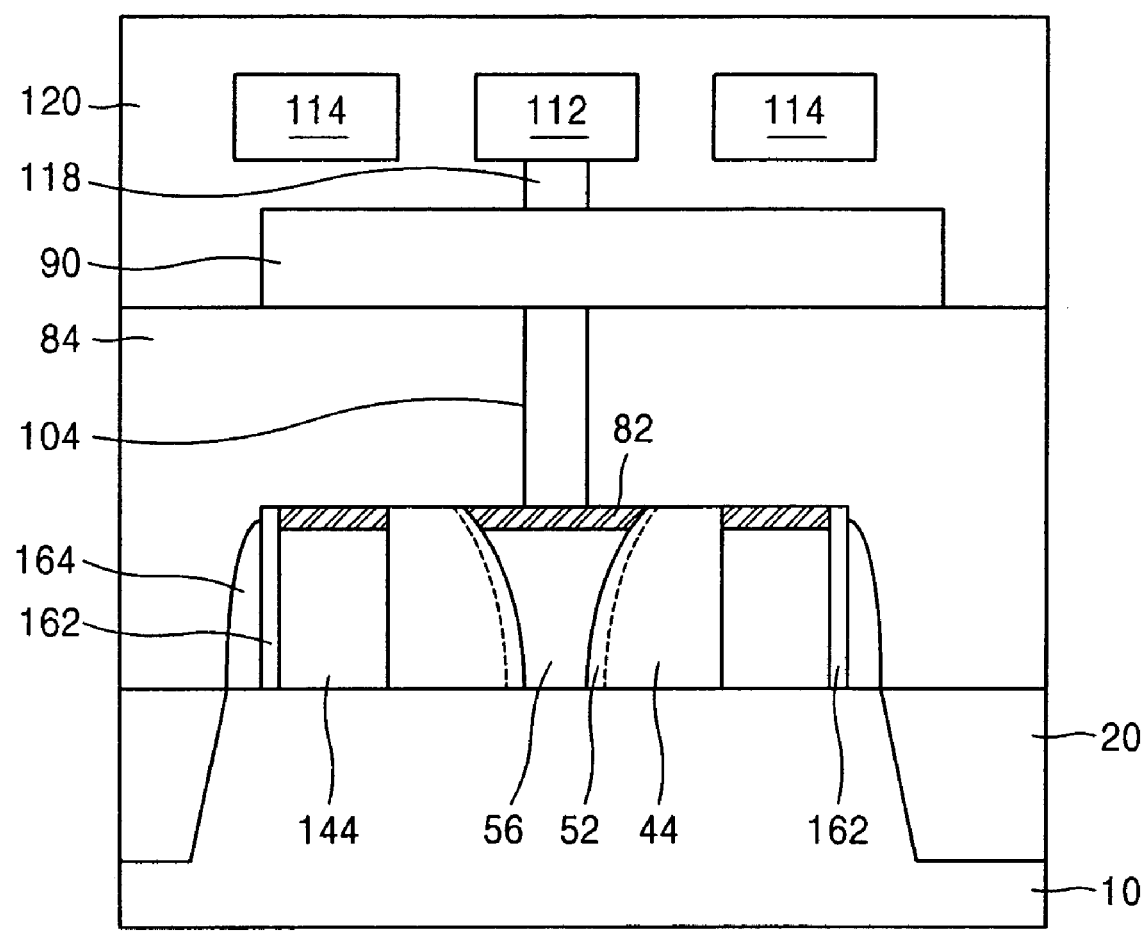
FIG. 15 is a sectional view taken along line XV—XV of FIG. 14.

FIG. 14 is a plan view illustrating a nonvolatile semiconductor memory device having a strap region according to a fourth embodiment of the present invention, and FIG. 15 is a sectional view taken along line XV—XV of FIG. 14. In FIG. 14, the same reference numerals as those of FIG. 6 denote the same elements, and in FIG. 15, the same reference numerals as those of FIG. 6 denote the same elements.

In detail, the inventive nonvolatile semiconductor memory device is the same as the third embodiment excepting that a source line contact 104 is formed over a dummy active region 19. In the present case where the source line contact 104 is formed over the dummy active region 19, "dishing" of the word line and the source line can be prevented when chemical-mechanical polishing is performed for forming an active region. As shown in the sectional view of FIG. 15, the source line contact 104 is connected with a source line contact 112 by using a metal jumper 90 and a metal via 118.

Fifth Embodiment

Figure 16:
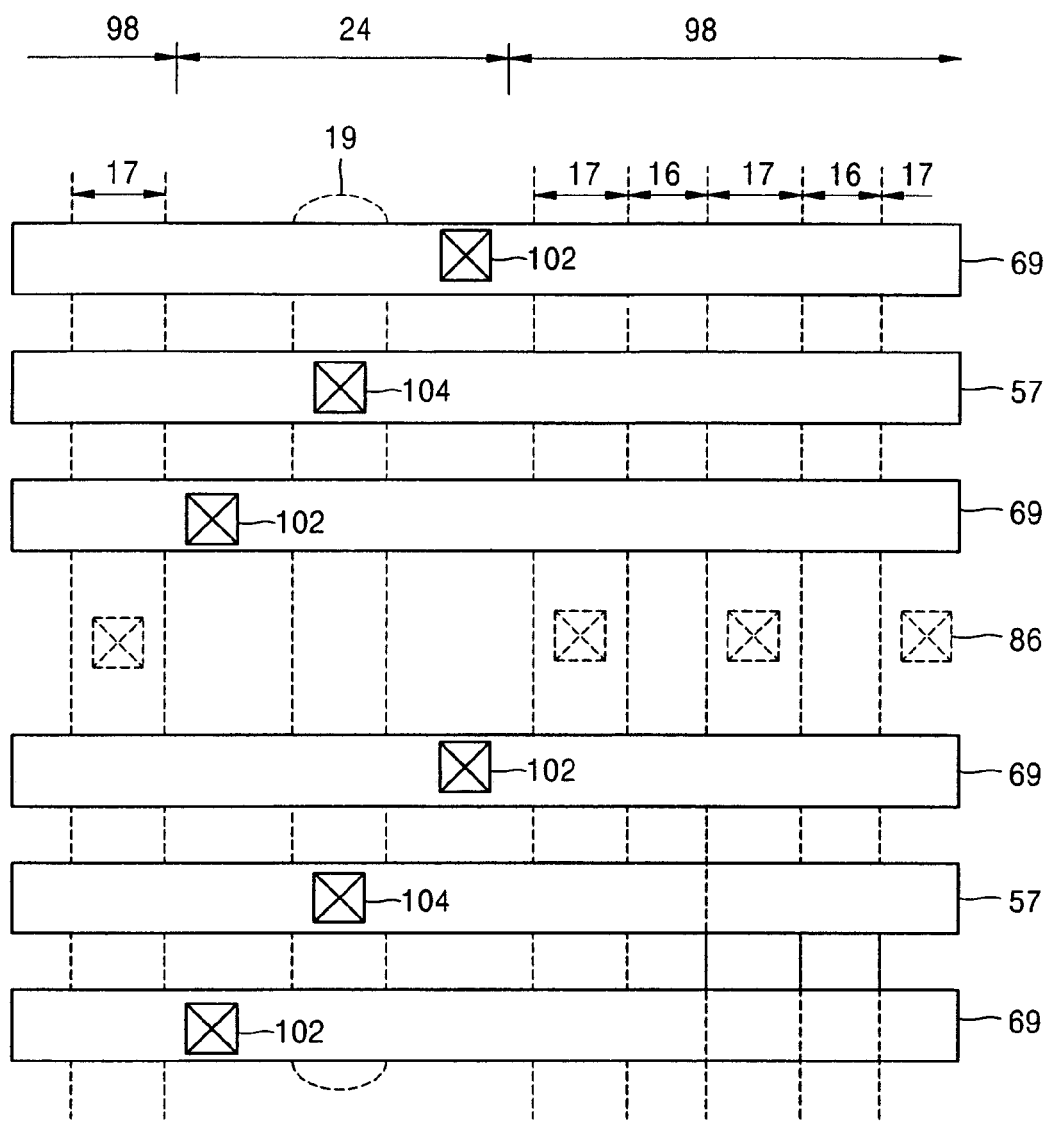
FIG. 16 is a plan view illustrating a nonvolatile semiconductor memory device having a strap region according to a fifth embodiment of the present invention.

FIG. 16 is a plan view illustrating a nonvolatile semiconductor memory device having a strap region according to a fifth embodiment of the present invention. In FIG. 16, the same reference numerals as those of FIGS. 6 and 14 denote the same elements.

In detail, the inventive nonvolatile semiconductor memory device is the same as the fourth embodiment, excepting that a dummy active region 19 is formed across a plurality of source line contacts 104. In more detail, the dummy active region 19 can be formed in a sector unit region or can be formed in a smaller region than the sector unit region when it is divided in a sector unit for an electrical operation. For example, in the case where the sector unit is comprised of eight word lines, the dummy active region 19 can be formed to extend in a column direction in a unit of one source line contact or in a unit of four source line contacts 104. For convenience, FIG. 14 illustrates the dummy active region 19, which is formed in the unit of one source line contact 104.

As described above, the inventive nonvolatile semiconductor memory device has the word line and the source line of the strap region, which are extended in the column direction while being straight-lined without separation from the word lines and the source lines of the memory cell array region. Accordingly, the bridge phenomenon can be prevented from occurring between the word lines, and the strap region can be easily formed.

While the present invention has been particularly shown and described with reference to exemplary embodiments thereof, it will be understood by those of ordinary skill in the art that various changes in form and detail may be made herein without departing from the spirit and scope of the present invention as defined by the following claims.

What is claimed is:

1. A nonvolatile semiconductor memory device having a memory cell array region and a strap region for providing a voltage to the memory cell array region,
   wherein in the memory cell array region, a plurality of word lines and a plurality of source lines extend in a row direction, and one source line is provided between two word lines, and
   wherein in the strap region, the word lines and the source lines extend in the row direction and are collinear with, and without separation from, the corresponding word lines and the source lines of the memory cell array region, and wherein each of the word lines and the source lines in the strap region respectively has a word line contact and a source line contact, and wherein each of the source lines in the strap region has a tapered cross section such that a width of a bottom portion of the source line is narrower than that of a top portion of the source line.

2. The device of claim 1, wherein the memory cell array region has an active region and an isolation region in a column direction.

3. The device of claim 1, wherein the source line contact is formed at a central portion of the strap region.

4. The device of claim 1, wherein a dummy active region is formed below the source line contact of the strap region and wherein the dummy active region extends in a column direction.

5. The device of claim 4, wherein the dummy active region extends in the column direction across a single, or multiple, source line contacts.

6. A nonvolatile semiconductor memory device having a memory cell array region and a strap region for providing a voltage to the memory cell array region,
   wherein in the memory cell array region, a plurality of word lines and a plurality of source lines extend in a row direction, and one source line is provided between two word lines, and
   wherein in the strap region, the word lines and the source lines extend in the row direction and are collinear with, and without separation from, the corresponding word lines and the source lines of the memory cell array region, and wherein each of the word lines and the source lines in the strap region respectively has a word line contact and a source line contact, and wherein a portion of the source line in the region of the source line contact is wider than a portion of the source line of the memory cell array region, and wherein each of the source lines in the strap region has a tapered cross section such that a width of a bottom portion of the source line is narrower than that of a ton portion of the source line.

7. The device of claim 6, wherein the memory cell array region has an active region and an isolation region in a column direction.

8. The device of claim 6, wherein the source line contact is formed at a central portion of the strap region.

9. A nonvolatile semiconductor memory device having a memory cell array region and a strap region for providing a voltage to the memory cell array region,
wherein in the memory cell array region, a plurality of word lines and a plurality of source lines extend in a row direction and one source line is provided between two word lines, and
wherein in the strap region, the word lines and the source lines extend in the row direction, and are collinear with, and without separation from, the corresponding word lines and the source lines of the memory cell array region, and wherein the strap region includes a word line strap cell having a word line contact connected with the word line of the memory cell array region and a source line strap cell having a source line contact connected with the source line of the memory cell array region, and wherein each of the source lines in the strap region has a tapered cross section such that a width of a bottom portion of the source line is narrower than that of a top portion of the source line.

10. The device of claim 9, wherein the memory cell array region has an active region and an isolation region in a column direction.

11. The device of claim 9, wherein the source line contact is formed at a central portion of the strap region.

12. A method of fabricating a nonvolatile semiconductor memory device having a memory cell array region and a strap region, the method comprising:
forming an insulating film on a semiconductor substrate of the memory cell array region and the strap region;
patterning the insulating film of the memory cell array region and the strap region to provide a first trench at the memory cell array region and the strap region;
forming a source line in the first trench of the memory cell array region and extending to the first trench of the strap region;
forming a word line at, and spaced apart from, an edge of the source line of the memory cell array region, and an edge of the source line of the strap region; and
forming a source line contact and a word line contact at each of the source line and the word line of the strap region;
wherein the source line in the strap region has a tapered cross section such that a width of a bottom portion of the source line is narrower than that of a top portion of the source line.

13. The method of claim 12, wherein a mask, which is used when the insulating film is patterned using photolithography to provide the first trench, has a straight-lined aperture through which light is transmitted when an exposure is performed.

14. The method of claim 12, wherein a mask used when the insulating film is patterned using photolithography to provide the first trench has an aperture, which is straight-lined and has a central portion that is wider than a remaining portion, and through which light is transmitted when an exposure is performed.

15. The method of claim 12, wherein the source line contact is formed at a central portion of the strap region.

16. The method of claim 12, wherein a portion of the source line in the region of the source line contact is wider than a portion of portion of the source line of the memory cell array region.

17. The method of claim 12, wherein the source line contact of the strap region is formed on a dummy active region.

18. The method of claim 12, wherein the strap region includes a word line strap cell having a word line contact connected with the word line of the memory cell array region and a source line strap cell having a source line contact connected with the source line of the memory cell array region.

19. The method of claim 18, wherein a mask, which is used when the insulating film is patterned using photolithography to provide the first trench, is divided into a first mask region for defining the word line strap cell, a second mask region for defining the source line strap cell, and a third mask region for defining the memory cell array region.

20. A nonvolatile semiconductor memory device comprising:
a semiconductor substrate having a memory cell array region and a strap region for providing a voltage to the memory cell array region;
an insulating layer on the semiconductor substrate in the strap region;
a first source line on the insulating layer of the strap region, the first source line having sidewalls;
first and second sidewall spacers on the sidewalls of the first source line;
first and second word lines on the insulating layer, the first word line contacting the first sidewall spacer and the second word line contacting the second sidewall spacer;
a third sidewall spacer contacting the first word line, the third sidewall spacer on the opposite side of the first word line with respect to the first sidewall spacer;
a fourth sidewall spacer contacting the second word line, the fourth sidewall spacer on the opposite side of the second word line with respect to the second sidewall spacer; and
wherein the first source line in the strap region has a tapered cross section such that a width of a bottom portion of the first source line is narrower than that of a top portion of the first source line.

21. The device of claim 20 further comprising metal silicide layers on the first word line, the second word line and the first source line.

22. The device of claim 21 further comprising a first passivation layer on the metal silicide layers and on the first, second, third and fourth sidewall spacers.

23. The device of claim 22 further comprising a strap jumper on the first passivation layer in the strap region.

24. The device of claim 23 further comprising a word line contact plug connecting one of the first and second word lines to the strap jumper.

25. The device of claim 24 further comprising a via contact plug on a portion of the strap jumper, wherein the strap jumper consists of a conductive material.

26. The device of claim 25 further comprising a word line strap on the via contact plug such that the word line strap is electrically connected to one of the first and second word lines.

27. The device of claim 26 further comprising a second passivation layer on the word line strap.

28. The device of claim 20, wherein each of the first and second sidewall spacers comprise an oxide layer.

29. The device of claim 20, wherein each of the first and second sidewall spacers comprise a bilayer having insulating characteristics.

30. The device of claim 20, wherein each of the third and fourth sidewall spacers comprise a nitride layer.

31. The device of claim 20, wherein each of the third and fourth sidewall spacers comprise a bilayer having insulating characteristics.

32. The device of claim 20 further comprising:
a source region in a surface portion of the memory cell region of the semiconductor substrate;
a second source line in the memory cell region, the second source line having sidewalls and contacting the source region;
fifth and sixth sidewall spacers on the sidewalls of the second source line, the fifth sidewall spacer contacting a portion of a first floating gate and the sixth sidewall spacer contacting a portion of a second floating gate;
a seventh sidewall spacer contacting a portion of the fifth sidewall spacer;
an eighth sidewall spacer contacting a portion of the sixth sidewall spacer; and
third and fourth word lines on a dielectric layer, the third word line contacting the seventh sidewall spacer and the fourth word line contacting the eighth sidewall spacer.

33. The device of claim 32, wherein the first and third word lines are electrically connected to each other.

34. The device of claim 33, wherein the first and third word lines are collinear with each other.

35. The device of claim 32, wherein the second and the fourth word lines are electrically connected to each other.

36. The device of claim 35, wherein the second and the fourth word lines are collinear with each other.

37. The device of claim 32, wherein the first and second source lines are electrically connected to each other.

38. The device of claim 37, wherein the first and second source lines are collinear with each other.

39. The device of claim 32, wherein a portion of each of the third and fourth word lines functions as a control gate.

40. A nonvolatile semiconductor memory device comprising:
a semiconductor substrate having a memory cell array region and a strap region for providing a voltage to the memory cell array region;
a dummy active region in a surface portion of semiconductor substrate in the strap region;
a first source line having sidewalls on the dummy active region, the first source line directly contacting the dummy active region;
first and second sidewall spacers on the sidewalls of the first source line;
first and second word lines on the dummy active region, the first word line contacting the first sidewall spacer and the second word line contacting the second sidewall spacer;
a third sidewall spacer contacting the first word line, the third sidewall spacer on the opposite side of the first word line with respect to the first sidewall spacer;
a fourth sidewall spacer contacting the second word line, the fourth sidewall spacer on the opposite side of the second word line with respect to the second sidewall spacer; and
wherein the first source line in the strap region has a tapered cross section such that a width of a bottom portion of the first source line is narrower than that of a top portion of the first source line.

41. The device of claim 40 further comprising:
a source region in a surface portion of the semiconductor substrate in the memory cell array region;
a second source line in the memory cell array region, the second source line having sidewalls and contacting the source region;
fifth and sixth sidewall spacers on the sidewalls of the second source line, the fifth sidewall spacer contacting a portion of a first floating gate and the sixth sidewall spacer contacting a portion of a second floating gate;
a seventh sidewall spacer contacting a portion of the fifth sidewall spacer;
an eighth sidewall spacer contacting a portion of the sixth sidewall spacer; and
third and fourth word lines on a dielectric layer, the third word line contacting the seventh sidewall spacer and the fourth word line contacting the eighth sidewall spacer.

42. A method of fabricating a nonvolatile semiconductor memory device comprising:
providing a semiconductor substrate having a memory cell array region and a strap region for supplying a voltage to the memory cell array region;
forming an insulating layer on the semiconductor substrate;
forming a first source line having sidewalls on the insulating layer of the strap region;
forming first and second sidewall spacers on the sidewalls of the first source line;
forming first and second word lines on the insulating layer, the first word line contacting the first sidewall spacer and the second word line contacting the second sidewall spacer;
forming a third sidewall spacer contacting the first word line, the third sidewall being formed on the opposite side of the first word line with respect to the first sidewall spacer;
forming a fourth sidewall spacer contacting the second word line, the fourth sidewall being formed on the opposite side of the second word line with respect to the second sidewall spacer; and
wherein the first source line in the strap region has a tapered cross section such that a width of a bottom portion of the first source line is narrower than that of a top portion of the first source line.

43. The method of claim 42 further comprising forming metal silicide layers on the first word line, the second word line and the first source line.

44. The method of claim 43 further comprising forming a first passivation layer on the metal silicide layers and on the first, second, third and fourth sidewall spacers.

45. The method of claim 44 further comprising forming a strap jumper on the first passivation layer.

46. The method of claim 45 further comprising forming a word line contact plug connecting one of the first and second word lines to the strap jumper.

47. The method of claim 46 further comprising forming a via contact plug on a portion of the strap jumper, wherein the strap jumper consists of a conductive material.

48. The method of claim 47 further comprising forming a word line strap on the via contact plug such that the word line strap is electrically connected to one of the first and second work lines.

49. The method of claim 48 further comprising forming a second passivation layer on the word line strap.

50. The method of claim 42, wherein each of the first and second sidewall spacers comprises an oxide layer.

51. The method of claim 42, wherein each of the first and second sidewall spacers comprises a bilayer having insulating characteristics.

52. The method of claim 42, wherein each of the third and fourth sidewall spacers comprises a nitride layer.

53. The method of claim 42, wherein each of the third and the fourth sidewall spacers comprises a bilayer having insulating characteristics.

54. The method of claim 42 further comprising:
   forming a source region in a surface portion of the semiconductor substrate in the memory cell array region;
   forming a second source line in the memory cell array region, the second source line having sidewalls and contacting the source region;
   forming fifth and sixth sidewall spacers on the sidewalls of the second source line, the fifth sidewall spacer contacting a portion of a first floating gate and the sixth sidewall spacer contacting a portion of a second floating gate;
   forming a seventh sidewall spacer contacting a portion of the fifth sidewall spacer;
   forming an eighth sidewall spacer contacting a portion of the sixth sidewall spacer; and
   forming third and fourth word lines on a dielectric layer, the third word line contacting the seventh sidewall spacer and the fourth word line contacting the eighth sidewall spacer.

55. The method of claim 54, wherein the first and the third word lines are electrically connected to each other.

56. The method of claim 55, wherein the first and third word lines are collinear with each other.

57. The method of claim 54, wherein the second and fourth word lines are electrically connected to each other.

58. The method of claim 57, wherein the second and fourth word lines are collinear with each other.

59. The method of claim 54, wherein the first and second source lines are electrically connected to each other.

60. The method of claim 59, wherein the first and second source lines are collinear with each other.

61. The method of claim 54, wherein a portion of each of the third and the fourth word lines functions as a control gate.

62. A method of fabricating a nonvolatile semiconductor memory device comprising:
   forming a semiconductor substrate having a memory cell array region and a strap region for providing a voltage to the memory cell array region;
   forming a dummy active region in a surface portion of the semiconductor substrate in the strap region;
   forming a first source line having sidewalls on the dummy active region, the first source line directly contacting the dummy active region;
   forming first and second sidewall spacers on the sidewalls of the first source line;
   forming first and second word lines on the dummy active region, the first word line contacting the first sidewall spacer and the second word line contacting the second sidewall spacer;
   forming a third sidewall spacer contacting the first word line, the third sidewall spacer being formed on the opposite side of the first word line with respect to the first sidewall spacer;
   forming a fourth sidewall spacer contacting the second word line, the fourth sidewall spacer being formed on the opposite side of the second word line with respect to the second sidewall spacer; and
   wherein the first source line in the strap region has a tapered cross section such that a width of a bottom portion of the first source line is narrower than that of a top portion of the first source line.

63. The method of claim 62 further comprising:
   forming a source region in a surface portion of the semiconductor substrate in the memory cell array region;
   forming a second source line in the memory cell array region, the second source line having sidewalls and contacting the source region;
   forming fifth and sixth sidewall spacers on the sidewalls of the second source line, the fifth sidewall spacer contacting a portion of a first floating gate and the sixth sidewall spacer contacting a portion of a second floating gate;
   forming a seventh sidewall spacer contacting a portion of the fifth sidewall spacers;
   forming an eighth sidewall spacer contacting a portion of the sixth sidewall spacer; and
   forming third and fourth word lines on a dielectric layer, the third word line contacting the seventh sidewall spacer and the fourth word line contacting the eighth sidewall spacer.

* * * * *

UNITED STATES PATENT AND TRADEMARK OFFICE
CERTIFICATE OF CORRECTION

PATENT NO. : 7,176,078 B2 Page 1 of 1
APPLICATION NO. : 11/167793
DATED : February 13, 2007
INVENTOR(S) : Yonghee Kim It is certified that error appears in the above-identified patent and that said Letters Patent is hereby corrected as shown below:

Column 12, line 66 delete "ton" and insert --top--

Signed and Sealed this

Eighth Day of May, 2007

JON W. DUDAS
*Director of the United States Patent and Trademark Office*